(12) United States Patent
Starr et al.

(10) Patent No.: US 8,009,385 B2
(45) Date of Patent: Aug. 30, 2011

(54) HIGH DENSITY ARRAY SYSTEM WITH ACTIVE MOVABLE MEDIA DRAWERS

(75) Inventors: Matthew Thomas Starr, Lafayette, CO (US); Walter Wong, Boulder, CO (US); Michael Edward Figaro, Golden, CO (US); Ronald Gregory Duren, Denver, CO (US); Matthew John Ninesling, Littleton, CO (US); Joshua Daniel Carter, Lafayette, CO (US); Scott Edward Bacom, Westminster, CO (US)

(73) Assignee: Spectra Logic Corporation, Boulder, CO (US)

(*) Notice: Subject to any disclaimer, the term of this patent is extended or adjusted under 35 U.S.C. 154(b) by 0 days.

(21) Appl. No.: 13/023,585

(22) Filed: Feb. 9, 2011

(65) Prior Publication Data

US 2011/0141874 A1     Jun. 16, 2011

Related U.S. Application Data

(62) Division of application No. 11/676,138, filed on Feb. 16, 2007, now Pat. No. 7,916,423.

(60) Provisional application No. 60/788,487, filed on Mar. 31, 2006.

(51) Int. Cl.
  *G11B 15/68* (2006.01)
  *G11B 33/02* (2006.01)
(52) U.S. Cl. ............... 360/98.01; 360/98.04; 360/98.06; 360/98.07
(58) Field of Classification Search ............... 360/98.01, 360/98.04, 98.05, 98.06, 98.07; 369/30.39
See application file for complete search history.

(56) References Cited

U.S. PATENT DOCUMENTS

| | | | |
|---|---|---|---|
| 5,760,995 | A | 6/1998 | Heller et al. |
| 6,070,742 | A | 6/2000 | McAnally et al. |
| 6,459,571 | B1 | 10/2002 | Carteau |
| 6,600,703 | B1 | 7/2003 | Emberty et al. |
| 6,639,751 | B2 | 10/2003 | Brace et al. |
| 6,650,961 | B2 | 11/2003 | Deckers |
| 6,957,291 | B2 | 10/2005 | Moon et al. |
| 6,987,674 | B2 * | 1/2006 | El-Batal et al. ............... 361/788 |

(Continued)

FOREIGN PATENT DOCUMENTS

WO    WO 2005/010661 A2    2/2005

(Continued)

OTHER PUBLICATIONS

U.S. Appl. No. 11/126,025, Rector et al.

(Continued)

*Primary Examiner* — Jefferson Evans
(74) *Attorney, Agent, or Firm* — Kenneth Altshuler

(57) ABSTRACT

A storage system is provided having at least one storage unit, the storage unit including an electrical power source, a communication source and a cover that defines, at least in part an interior space. The storage system operates with a media blade that comprises a plurality of data storage elements, the media blade moveable in a drawer like motion though a cooperating opening in the cover. The storage system further includes a motion accommodating conductor apparatus connecting the plurality of data storage elements to the electrical power source and the communication source such that power from the electrical power source and communication from the communication source may be provided to the media blade without interruption when the media blade is moved in the drawer like motion outward from at least partially within the interior space.

20 Claims, 19 Drawing Sheets

U.S. PATENT DOCUMENTS

| | | | |
|---|---|---|---|
| 7,583,507 B2 * | 9/2009 | Starr et al. | 361/727 |
| 7,864,519 B2 * | 1/2011 | Lin et al. | 361/679.33 |
| 2003/0040836 A1 | 2/2003 | Deckers | |
| 2003/0049105 A1 | 3/2003 | Mueller | |
| 2003/0076618 A1 | 4/2003 | Brace et al. | |
| 2003/0081513 A1 | 5/2003 | Holmquist et al. | |
| 2004/0105187 A1 | 6/2004 | Woodruff et al. | |
| 2004/0181388 A1 | 9/2004 | Yip et al. | |
| 2004/0223253 A1 | 11/2004 | Woodruff et al. | |
| 2004/0264037 A1 | 12/2004 | Downey et al. | |
| 2004/0264038 A1 | 12/2004 | Heineman et al. | |
| 2004/0264039 A1 | 12/2004 | Armagost et al. | |
| 2004/0264040 A1 | 12/2004 | Armagost et al. | |
| 2004/0264041 A1 | 12/2004 | Kumpon et al. | |
| 2004/0264042 A1 | 12/2004 | Pollard et al. | |
| 2005/0007692 A1 | 1/2005 | Thompson et al. | |
| 2005/0047258 A1 | 3/2005 | Starr et al. | |
| 2005/0063089 A1 | 3/2005 | Starr et al. | |
| 2005/0065637 A1 | 3/2005 | Lantry et al. | |
| 2005/0152061 A1 | 7/2005 | Hoelsaeter | |
| 2005/0168934 A1 * | 8/2005 | Wendel et al. | 361/685 |
| 2005/0195517 A1 | 9/2005 | Brace et al. | |
| 2005/0195518 A1 | 9/2005 | Starr et al. | |
| 2005/0195519 A1 | 9/2005 | Kumpon et al. | |
| 2005/0195520 A1 | 9/2005 | Starr et al. | |
| 2005/0219964 A1 | 10/2005 | Pollard et al. | |
| 2005/0246484 A1 | 11/2005 | Lantry et al. | |
| 2005/0267627 A1 | 12/2005 | Lantry et al. | |
| 2006/0061955 A1 | 3/2006 | Imblum | |
| 2006/0064953 A1 | 3/2006 | Wong | |
| 2006/0070059 A1 | 3/2006 | Starr et al. | |
| 2006/0095657 A1 | 5/2006 | Rector et al. | |
| 2006/0112138 A1 | 5/2006 | Fenske et al. | |
| 2006/0126209 A1 | 6/2006 | Starr et al. | |
| 2006/0134997 A1 | 6/2006 | Curtis et al. | |
| 2006/0161936 A1 | 7/2006 | Permut et al. | |
| 2006/0164928 A1 | 7/2006 | Starr et al. | |
| 2006/0215300 A1 | 9/2006 | Starr et al. | |

FOREIGN PATENT DOCUMENTS

| | | |
|---|---|---|
| WO | 2005/046447 | 12/2005 |

OTHER PUBLICATIONS

U.S. Appl. No. 11/145,768, Downey et al.
U.S. Appl. No. 11/230,146, Starr et al.
U.S. Appl. No. 11/240,893, Starr et al.
U.S. Appl. No. 11/264,920, Lantry et al.

* cited by examiner

HIGH DENSITY ARRAY SYSTEM WITH ACTIVE MOVABLE MEDIA DRAWERS

CROSS-REFERENCE TO RELATED APPLICATIONS

This application is a Divisional Application of U.S. Ser. No. 12/676,138, entitled HIGH DENSITY ARRAY SYSTEM WITH ACTIVE MOVABLE MEDIA DRAWERS, filed Feb. 16, 2007, which is incorporated herein by reference, which is a Non-Provisional Patent Application from U.S. Provisional Patent Application No. 60/788,487 filed Mar. 31, 2006.

FIELD OF THE INVENTION

The present invention is directed to a storage unit that is useful in storing data to any one of a plurality of storage elements associated with a frame that can be moved at least partially out of the storage unit without power and communication interruption to the storage elements.

BACKGROUND OF THE INVENTION

Presently, data storage units, such as mass data storage libraries and RAID (Redundant Array of Independent Disks/Drives) systems, each employing multiple storage elements, are primarily used to archive data, i.e., store data that is not immediately needed by the host computer, and provide archived data to the host computer when the data is needed. To elaborate, a typical data storage unit receives data from a host computer and causes the data to be stored or recorded on a recording medium typically located in one or more of the storage elements, such as a disk drive for example. When the host computer requires some of the data that was previously stored in the storage elements, a request for the data is sent from the host computer to the data storage unit to fulfill real-time data retrieval needs. In response, the data storage unit retrieves the data from the storage elements, and transmits the retrieved data to the host computer system.

From time to time, there may be reason to remove one or more storage elements from a data storage unit, such as for repair, maintenance or upgrades. This generally results in removing panels associated with a data storage unit cover in order to access the storage elements inside the data storage unit. Typically, the process of removing one or more storage elements from a data storage unit further requires turning off the power to the data storage unit.

In an effort to improve accessing powered storage elements operable with a data storage unit both methods and apparatus are disclosed herein. It is to innovations related to this subject matter that the claimed invention is generally directed.

SUMMARY OF THE INVENTION

The present invention relates generally to a storage unit that is useful in storing data to any one of a plurality of storage elements supported by a drawer like structure that can be moved at least partially out of the storage unit without power and communication interruption to the storage elements.

Embodiment of the present invention can therefore comprise a data storage unit comprising: an electrical power source; a cover that defines at least in part an interior space, the cover having a first opening; a media blade comprising a plurality of data storage elements and a connector apparatus connecting to the plurality of data storage elements; and a motion accommodating conductor apparatus connecting the connector apparatus to the electrical power source, the electrical power source supplying power without interruption to the media blade when the media blade is moved via the first opening from between a first position that is substantially in the interior space and a second position that is less than substantially in the interior space.

Another embodiment of the present invention can therefore comprise a method of operating a data storage unit wherein the data storage unit comprises a cover that defines at least in part an interior space, the method comprising the steps of: receiving a first data package from a host; storing the first data package on at least one of a plurality of data storage elements associated with a first media blade; moving the first media blade in a drawer like motion, via an accommodating opening in the cover, from between a first position, that is substantially within the interior space, and a second position, that is less than substantially within the interior space, while the storing step is being performed and without interrupting the storing step.

Yet another embodiment of the present invention can therefore comprise a data storage unit comprising: an electrical power source; a communication source; a cover that defines at least in part an interior space, the cover having a cooperating opening; a media blade comprising a plurality of data storage elements, the media blade moveable in a drawer like motion though the cooperating opening in the cover; a motion accommodating conductor apparatus connecting the plurality of data storage elements to the electrical power source and the communication source such that power from the electrical power source and communication from the communication source may be provided to the media blade without interruption when the media blade is moved in the drawer like motion outward from at least partially within the interior space.

DETAILED DESCRIPTION

Figure 1A:
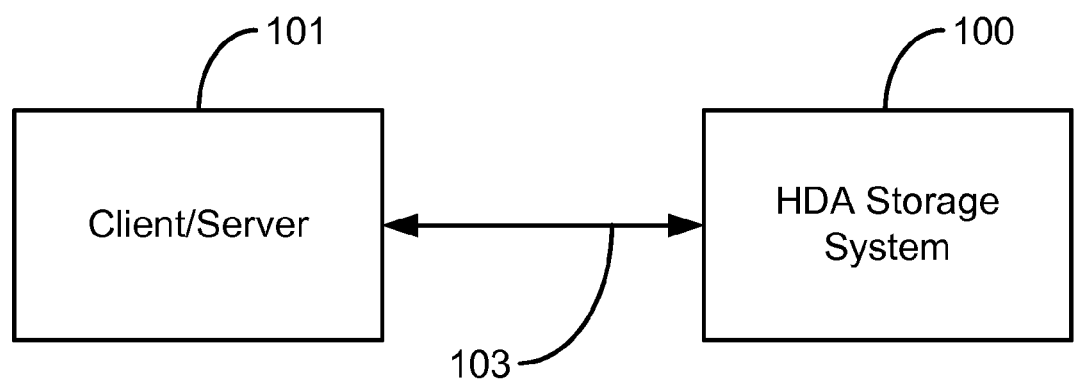
FIG. 1A is a block diagram of a data storage arrangement constructed in accordance with an embodiment of the present invention.

Referring to the drawings in general, and more specifically to FIG. 1A, shown therein is a block diagram of a data storage arrangement constructed in accordance with an embodiment of the present invention. In what follows, similar or identical structure is identified using identical callouts.

The data storage arrangement illustrated in FIG. 1A can comprise a client/server 101 in communication 103 (i.e. linked) with a High Density Array (HDA) data storage system 100. The client/server 101 can be a host computer or some other consumer/producer of data; other embodiments can also include another storage library or a streaming output device, such as a video server, to name several examples. The client 101 is an entity, or entities, that is capable of 'taking in' data, for example a client/server 101 is a consumer when receiving data and an HDA 100 is a consumer when receiving data. As one skilled in the art will appreciate, in addition to 'taking in' data, a consumer of data is also generally capable of manipulating and/or transmitting data. The client 101 can be a personal computer, a main frame computer, a server, or any computer system operatively linked to the HDA 100, to name a few examples. The communication path 103, at a minimum, needs only to facilitate communication between the client/server 101 and the HDA 100. The means for communication can be accomplished by a dedicated pathway (such as a SCSI [Small Computer Systems Interface] cabled connection), fiber-channel or, in an alternative embodiment, a pathway over a network (such as a LAN, WAN, or other communication architecture), for example. Furthermore, the communication path can be in the form of (not to be limited by) a wire line pathway, wireless, fiber channel or a combination thereof.

Figure 1B:
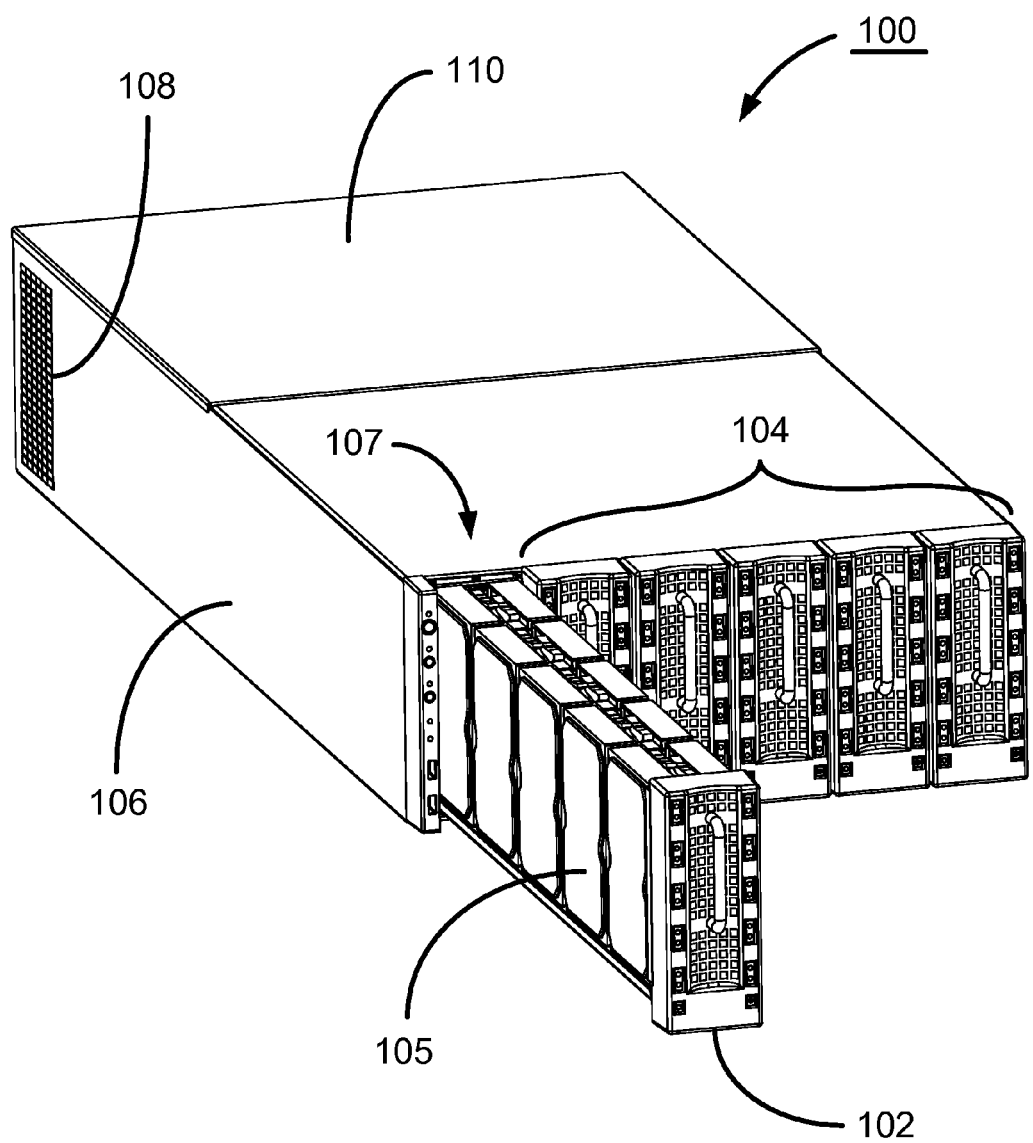
FIG. 1B shows a commercial embodiment of a High Density Array (HDA) unit consistent with embodiments of the present invention.

Embodiments of the present invention can be commercially practiced in a Spectra Logic HDA manufactured by Spectra Logic of Boulder Colo. FIG. 1B shows a commercial embodiment of one HDA unit 100 with a first storage media blade 102, comprising ten disk drives 105, in an extended position and five additional storage media blades 104, each capable of comprising ten disk drives 105, or less, in a fully retracted position. A retracted position is when a media blade 104 is substantially in the interior space of the HDA unit 100 and extended position can be wherein a media blade, such as the media blade 102, is less than substantially in the interior space of the HDA unit 100. In the illustrative embodiment shown here, the media blade 102 is moved partially out from the interior space of the HDA unit 100 through an accommodating opening 107 that cooperates with the media blade 102 such that the media blade 102 is moveable (i.e., the ability to be moved) in a drawer like motion. The media blade 102 is shown guided through the opening 107 to extend from the HDA unit 100 in a linear direction. A media blade 104 can be optimized for load balancing, power balancing, capacity balancing, etc. Power and communication can be provided to the storage media blades 102 and 104 via an electrical power source and communication source which can be disposed in the HDA unit 100 without interruption regardless of whether the storage media blades 102 and 104 are in a retracted position, extended position, or a position there between. In other words, the storage media blade 104 can be in a powered state independent of the location of the blade 104. Also, the communication link with a media blade, such as blade 102, can be accomplished with a wire line, fiber optic cable, or wirelessly such as by infra-red, radio frequency or other type of wireless transmission. Each blade 102 and 104 can be configured to store data with back-up capabilities such as in a RAID (Redundant Array of Inexpensive Disk [drives]) configuration, for example RAID level-5 or RAID level-6, or without redundancy. In an alternative embodiment, back-up configurations can be accomplished by writing redundant data across different blades 102 and 104 or across multiple HDA units that are interconnected. As one skilled in the art will appreciate, there are numerous RAID configurations which are optimized to an end user's desire to balance storage speed performance with redundancy of data. The HDA unit 100 is substantially encased on four sides (top, bottom, left side and right side) by a cover 106 and a removable panel 110 which define an interior space of the HDA unit 100. A vent 108 is provided in the cover 106 for cooling purposes which, as known by a skilled artisan, is not limited by quantity, size or location.

Figure 1C:
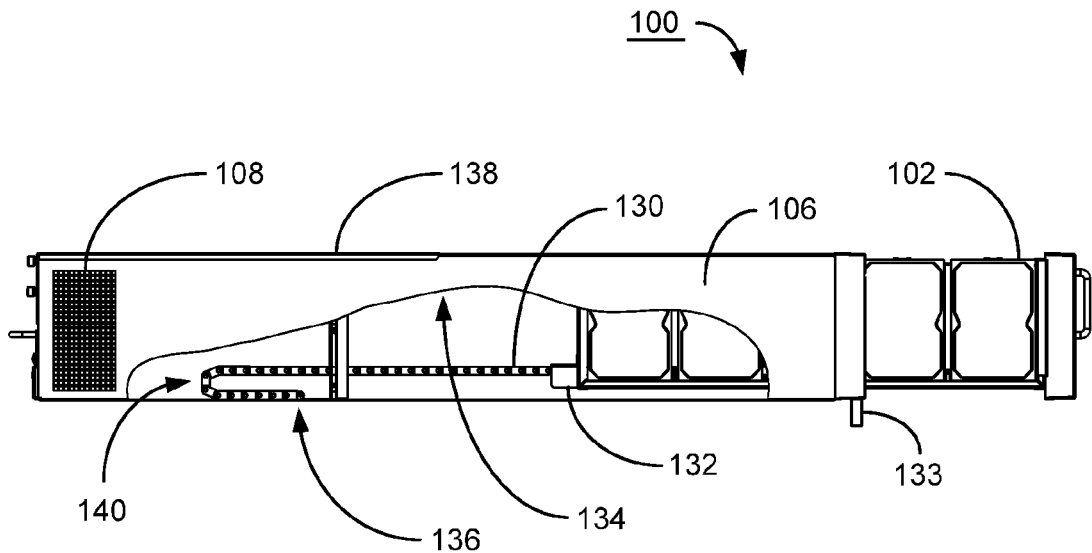
FIG. 1C is a side view of the HDA unit illustrating one embodiment of a means to provide uninterrupted power and communication to a storage media blade when the storage media blade is moved between a retracted and extended position.

FIG. 1C is a side view of the HDA unit 100 illustrating one embodiment of a means to provide uninterrupted power and communication to a storage media blade 102 when the storage media blade 102 is moved between a retracted and extended position. As revealed through the cutaway 134 in the cover 106, power and communication are provided to the storage media blade 102 from the HDA unit 100 via motion accommodating conductor apparatus, which in this illustrative embodiment is a flex cable (not shown) supported by a flex chain linkage 130 (or other equivalent flexible cable carrier that prevents tangling of the flexible cable, i.e. is tangle inhibiting), such as an IGUS chain from IGUS Corporation of Koln, Germany, that connects to the HDA unit 100 at a back plane connector 136 and the storage media blade 102 at a blade connector apparatus 132. Alternatives to a flex cable can include a flexible ribbon cable or flexible individual or semi-individual group of wires (such as one or more ipass cables provided by Molex Corporation of San Jose, Calif.) just to name several examples that can accomplish the same functionality without deviating from the present invention. The flex cable linkage 130 tracks the movement of the storage media blade 102 providing uninterrupted power and communication from a retracted position to an extended position without binding or tangling, as shown by the pivoting links to form a bend 140 in the linkage 130. In one embodiment, a blade latch mechanism 133, such as a Richco R1001 card inserter/extractor, of Richco Inc., of Morton Groove, Ill., can be provided to limit the extension of the storage media blade 102 thus retaining a portion of the blade 102 in the HDA unit 100 for stability and support when in the extended position (for an operator to access the disk drives 105, or an alternative data storage device, associated with the blade 102). The blade latch mechanism 133 can be manipulated to unlatch the storage media blade 102 allowing removal of the blade 102 from the HDA unit 100.

Figure 1D:
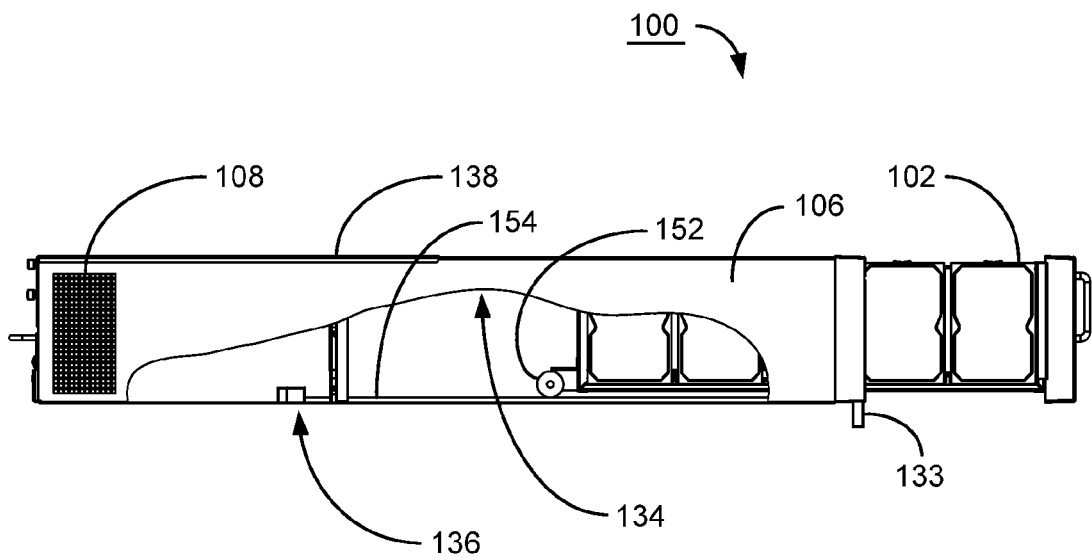
FIG. 1D is a side view of the HDA unit illustrating an alternative embodiment of a means to provide uninterrupted power and communication to a storage media blade when the storage media blade is moved between a retracted and extended position.

FIG. 1D is a side view of the HDA unit 100 illustrating an alternative embodiment of a means to provide uninterrupted power and communication to a storage media blade 102 when the storage media blade 102 is moved between a retracted and extended position. As revealed through the cutaway 134 in the cover 106, power and communication are provided to the storage media blade 102 via a conductive wheel 152 (or optionally a brush system) that is in contact with a conductive path 154 connected to a back plane connector 136, for example. As the storage media blade 102 is moved between a retracted position and a fully extended position, the conductive wheel 152 can continuously provide power and communication to the blade 102 while in contact with the conductive path 154. Optionally, the conductive wheel 152 and conductive path 154 can provide only power with data transmitted wirelessly. The blade latch mechanism 133, as previously described, can serve the purpose of retaining the storage media blade 102 partially in the HDA unit 100 unless made to disengage the blade 102 from the unit 100.

Figure 1E:
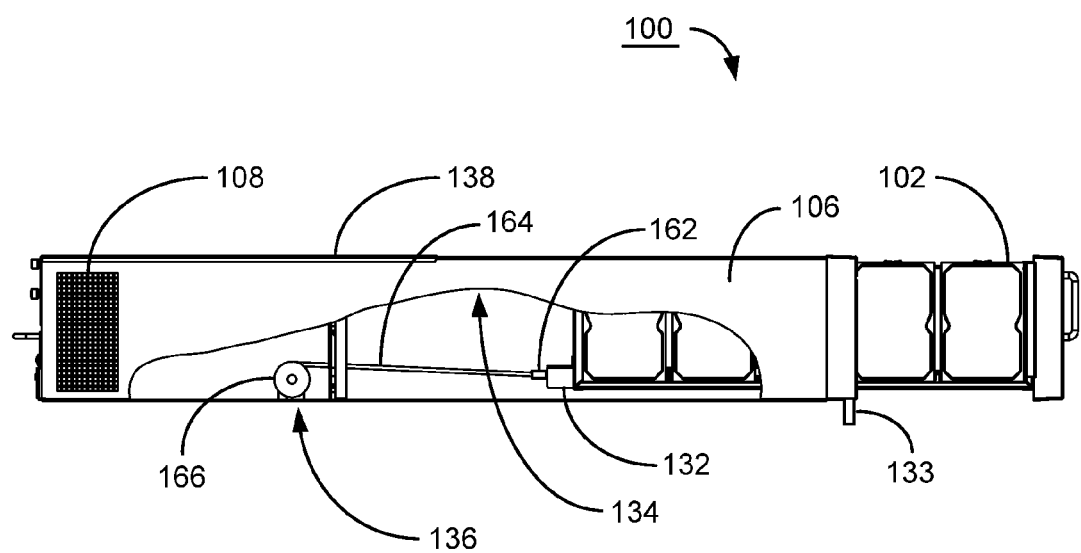
FIG. 1E is a side view of the HDA unit illustrating yet another alternative embodiment of a means to provide uninterrupted power and communication to a storage media blade when the storage media blade is moved between a retracted and extended position.

FIG. 1E is a side view of the HDA unit 100 illustrating yet another embodiment of a means to provide uninterrupted power and communication to a storage media blade 102 when the storage media blade 102 is moved between a retracted and extended position. As revealed through the cutaway 134 in the cover 106, power and communication are provided to the storage media blade 102 via a flex cable 164 that connects to the HDA unit 100 at a back plane connector 136 and the storage media blade 102 at a blade connector 132. In this embodiment, the flex cable 164 maintains tension via a spring-loaded spindle 166, in order to prevent binding or tangling. As one skilled in the art will appreciate, FIGS. 1B, 1C and 1D are illustrative of the many optional ways to provide uninterrupted power and communication to a storage media blade 102 when moved between a retracted and extended position.

Figure 2A:
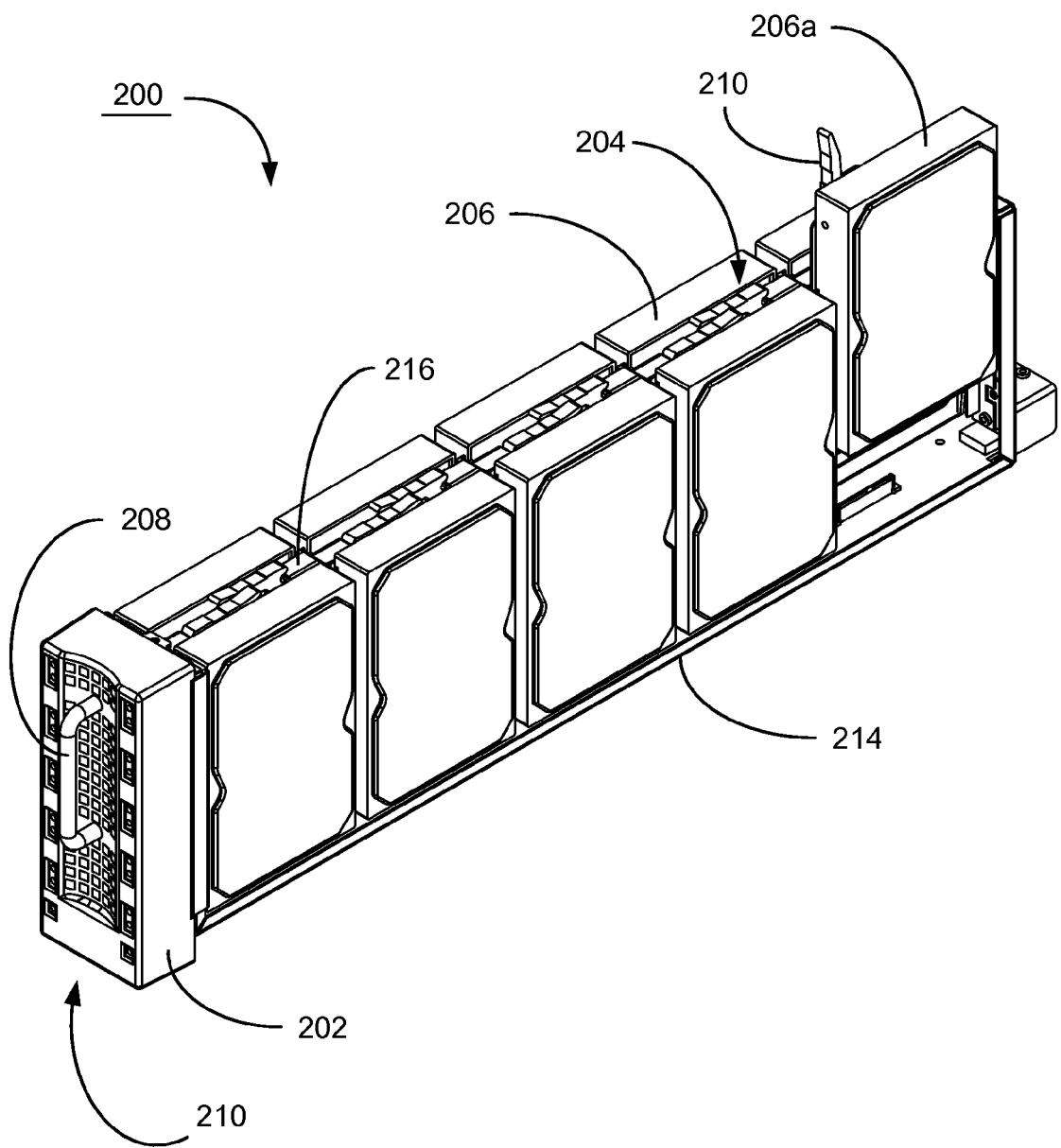
FIG. 2A is one commercial configuration of a storage media blade populated with ten disk drives consistent with embodiments of the present invention.

With reference to FIG. 2A, shown therein is one commercial configuration of a storage media blade 200 populated with ten 3.5 inch form factor disk drives 206, such as a Barracuda class disk drive manufactured by Seagate Corporation of Scotts Valley, Calif. In an alternative embodiment, the storage media blade 200 can accommodate different form factor drives, such as 2.5 inch disk drive and 3.5 inch disk drive for example. Optionally, the storage blade 200 may be limited to accommodating a specific form factor disk drive or alternate kind of medium, such as flash memory cards, or a combination therein, for example. In yet another alternative embodiment, the storage blade 200 may comprise disk drives with different storage capacities (wherein, in one embodiment, the lowest capacity drive may be the determining capacity of all other drives on the blade 200) and storage speeds. In addition to the disk drives 206, one embodiment of the storage media blade 200 can comprises a bezel module 202 with a handle 208 at a front end 210, a blade plate 214 which supports a blade plate board (not shown) for providing power to the disk drives 206 and a mid-plane frame 216 shown interposed between the drives 206 which can cooperate with retaining mechanisms 204 wherein a retaining mechanism 204 can further comprise a latch 210 for locking and unlocking (removably locking) a drive 206 in place. As illustrated, a disk drive 206a is partially ejected from the blade plate 214. In this embodiment, the disk drives 206 are oppositely disposed relative the mid-plane frame 216 providing the added advantage of oppositely rotating disks (not shown) comprised by the disk drives 206 reducing the vibration of the storage media blade 200 when fully populated. Additional vibration control means can be provided, such as dampeners and wedge shaped locking mechanisms associated with the blade 200, just to name a couple of examples.

Figure 2B:
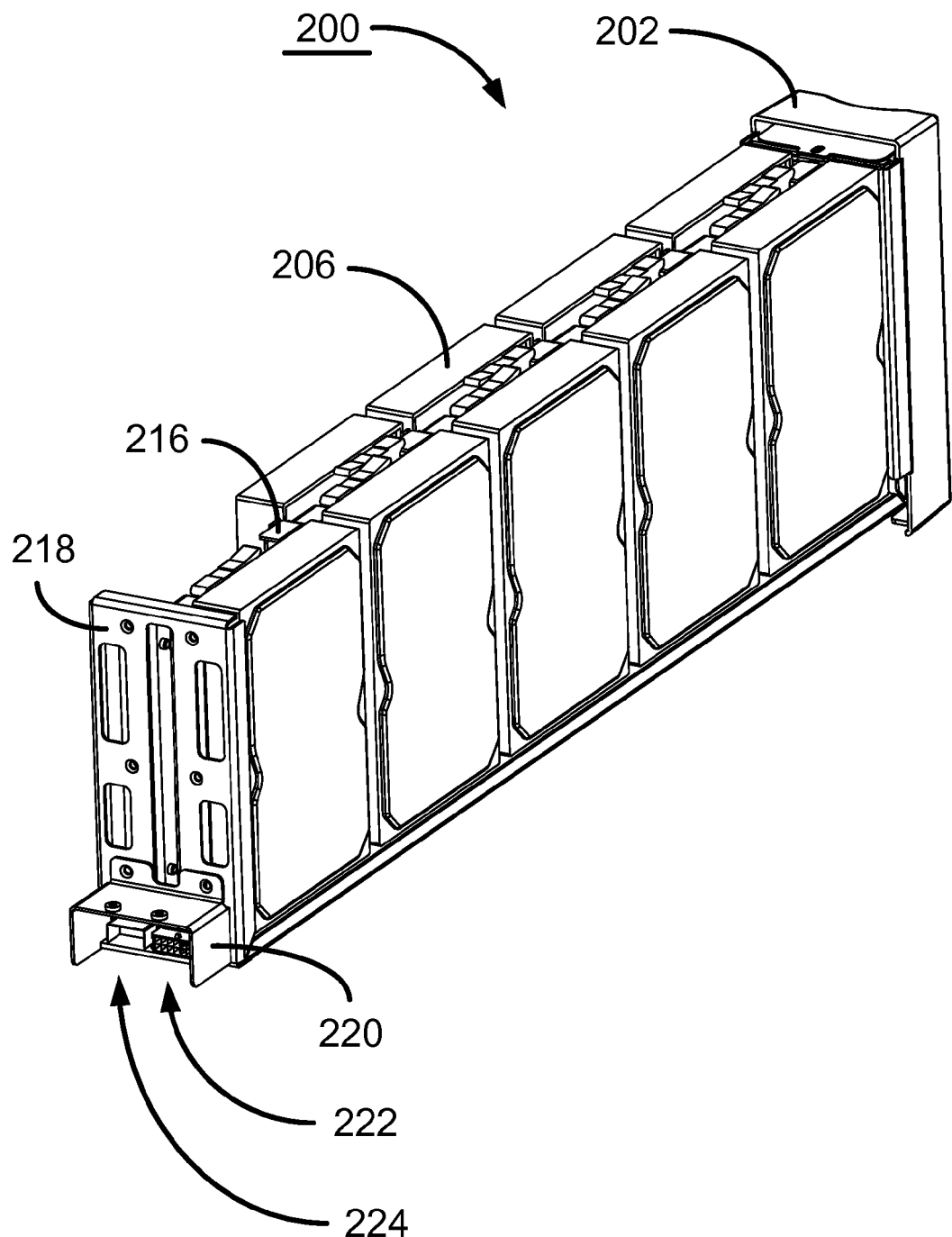
FIG. 2B shows a back view of the storage media blade populated with nine disk drives consistent with embodiments of the present invention.

FIG. 2B shows a back view of the storage media blade 200 wherein the storage media blade 200 is populated with nine disk drives 206. The storage media blade 200 receives and transmits data over a blade SAS (Serial Attached SCSI) connector 224 receives power over a blade power connector 222. As a skilled artisan will appreciate, a variety of connector types and configurations can be used to accomplish the same functionality. A rear blade plate 218 provides support for a connector shroud 220 which not only protects the connectors 222 and 224 but provides a mounting location for an uninterruptible power and communication system, such as flex cable linkage 130.

Figure 2C:
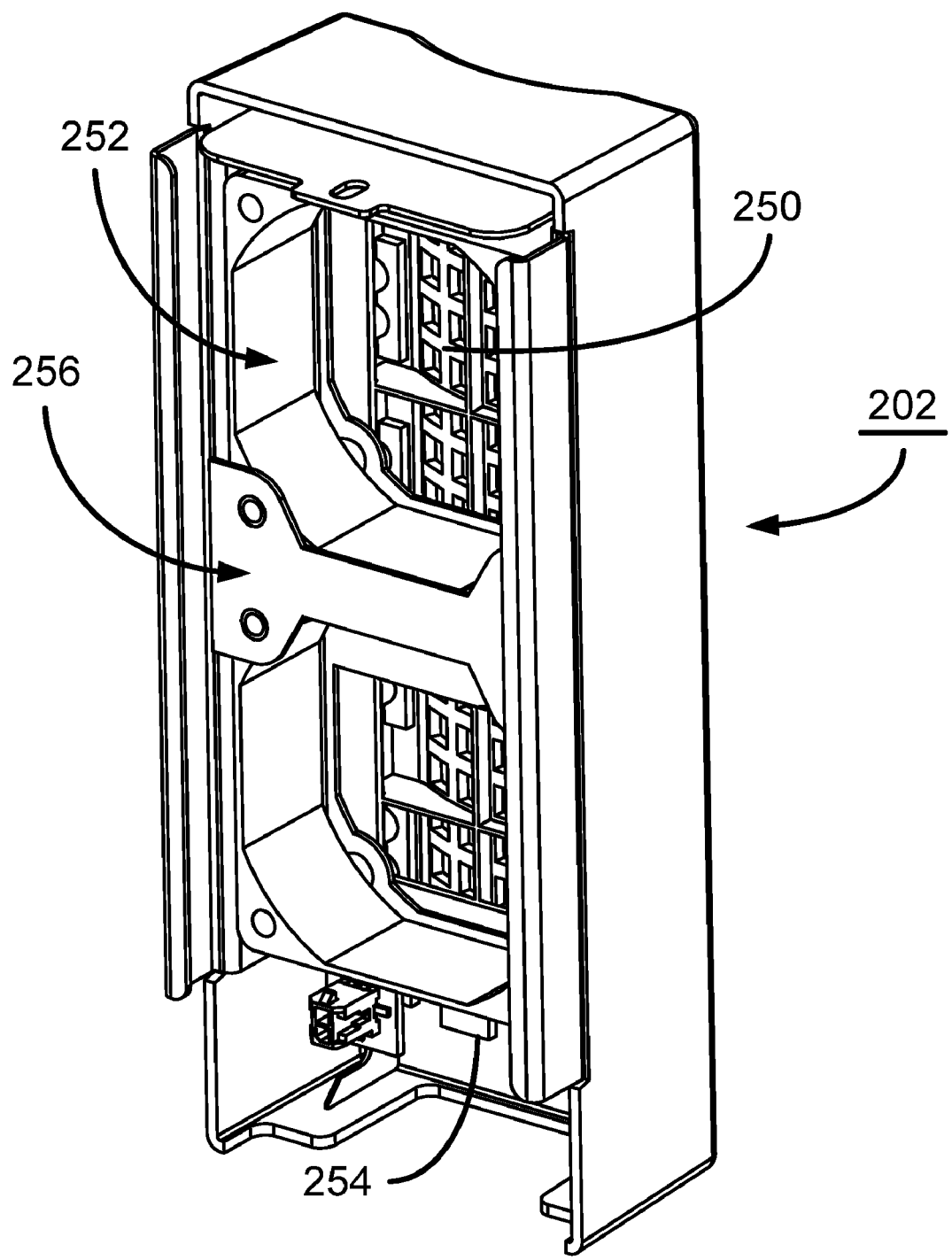
FIG. 2C shows the back side of a bezel module consistent with embodiments of the present invention.

FIG. 2C shows the back side 256 of the bezel module 202. The bezel module 202, in one embodiment of the present invention, is adapted for easy replacement should a failure occur. Herein, the bezel module 202 can accommodate two fans (not shown) in two bezel fan housings 252 and 254 that can pull air through vents 250 in the face of the bezel module 202 for cooling the disk drives 206. Power is provided to the bezel module 202 via a connector 254. In one embodiment, a locking feature (not shown) can optionally be used with the bezel module 202 for rapid access.

Figure 3:
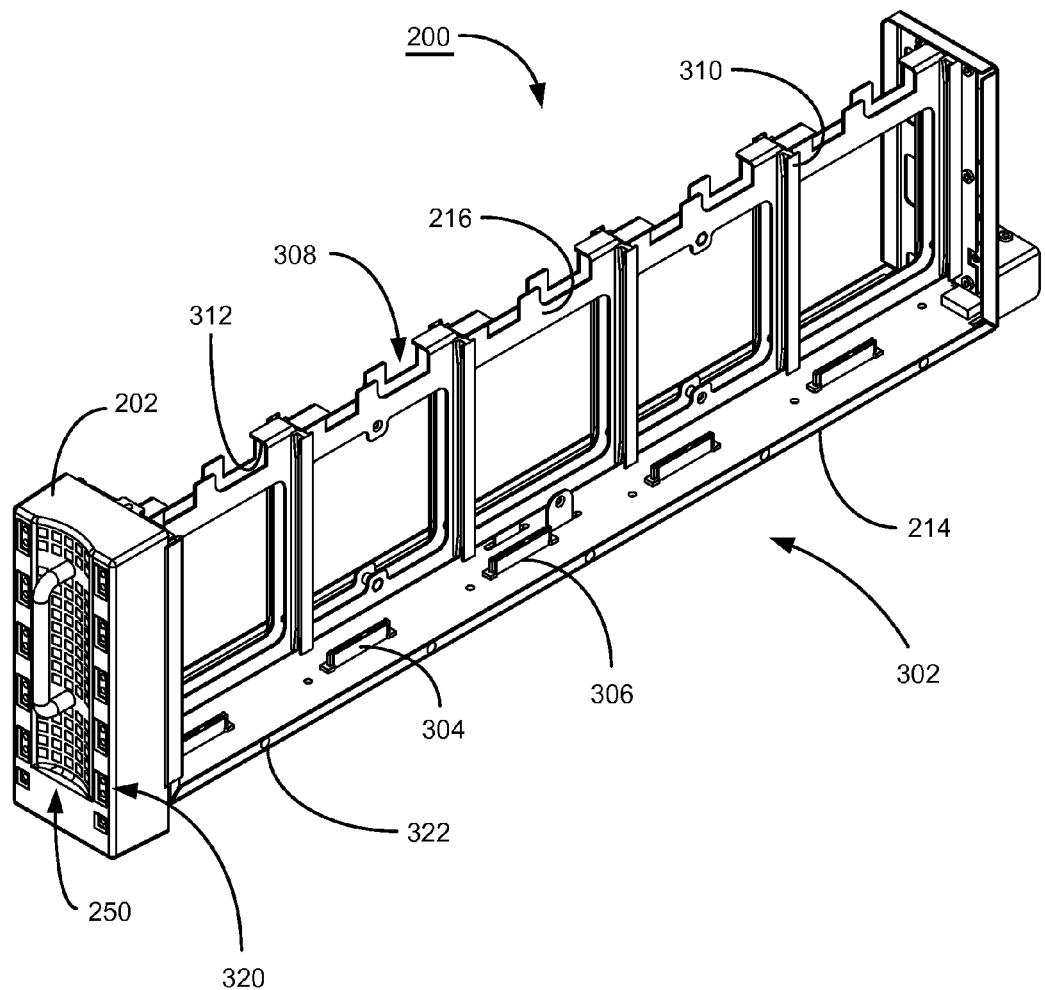
FIG. 3 shows the storage media blade of FIG. 2A without disk drives consistent with embodiments of the present invention.

FIG. 3 shows the storage media blade 200 of FIG. 2A without disk drives 206. The HDA storage media blade 200 generally comprises a frame 302 that can accommodate a bezel module 202, a blade plate 214 and a mid-plane frame 216 capable of supporting retaining mechanisms 204 in accommodating retaining mechanism locations 308. The blade plate 214 comprises connector openings 306 such as for SAS (Serial Attached SCSI) connectors 304, or alternative data connectors such as Serial ATA connectors for example, integrated with a blade plate board (not shown) attached to the underside of the blade plate 214. Disk drives 206 are adapted to plug into the SAS connectors 304 in a male/female relationship for linking to power and communication. The blade plate 214 can, optionally, comprise base plate indication lights 322, such as LEDs (Light Emitting Diode) or terminations of light pipes, that in the illustrative embodiment are in proximity to the disk drives 206. In one embodiment the indication lights 322 can be connected to the bezel indication lights 320 located on the face of the bezel module 202. The indication lights 320 and 322 indicate activity and functionality of any particular disk drive 206. The indication lights 320 and 322 indicate functional status such as on, off, rest mode, malfunctioning, unresponsive, etc. The base plate indication lights 322 can provide drive 206 location, for use by an operator for example, to the coinciding bezel indication light 320 when the blade 200 is in at least an extended position. As is appreciated by one skilled in the art, the blade 200 is not limited to SAS connectors 304 rather a variety of alternate connector configurations can be substituted without deviating from the functionality of the present invention.

Figure 4:
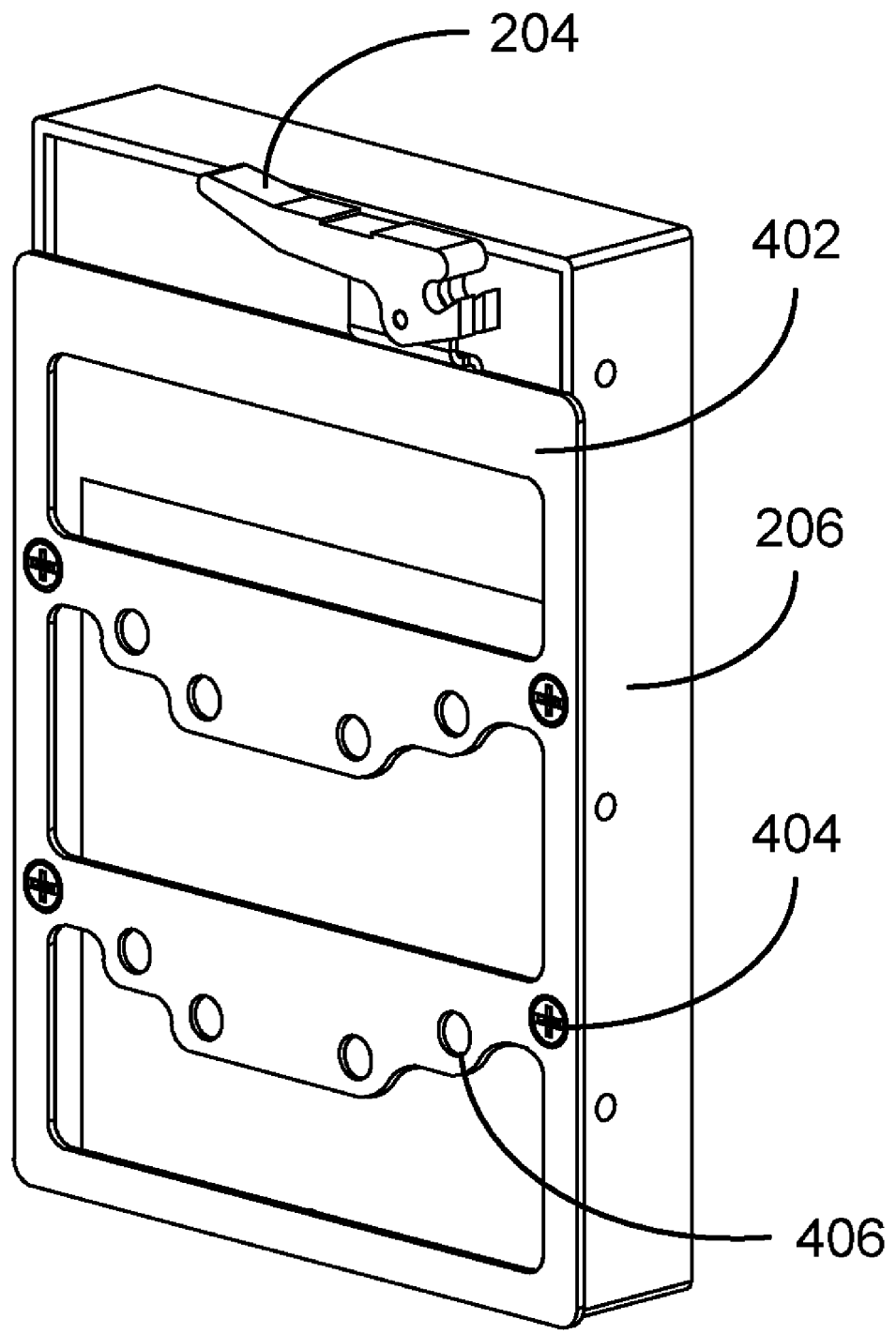
FIG. 4 shows an embodiment consistent with the present invention of a retaining mechanism of the illustrative commercial HDA embodiment in more detail.

FIG. 4 shows a retaining mechanism 204 of the illustrative commercial HDA embodiment in more detail. The retaining mechanism 204 is generally comprised of a latch 204 pivotally attached to a disk drive retaining plate 402. The retaining plate 402 is attached to the drive 206 by four screws 404 aligned with mounting holes (not shown) in the disk drive 206. The retaining plate 402 can be configured with additional mounting holes 406 to accommodate alternative form factor drives, such as 2.5 inch, or 1 inch mini drives for example. The latch 204 is adapted to cooperate with a retaining structure 312 shown in the frame 200 of FIG. 3. The retaining plate 402 is adapted to slideably engage accommodating retaining flanges 310 located at the mid-plane frame 216 of FIG. 3 whereby the disk drive is aligned to connect with a connector 304. A spring ejection mechanism, not shown, can also be used. As is appreciated by one skilled in the art, there are a number of alternative retaining and ejecting configurations that accomplish the same functionality.

Figure 5:
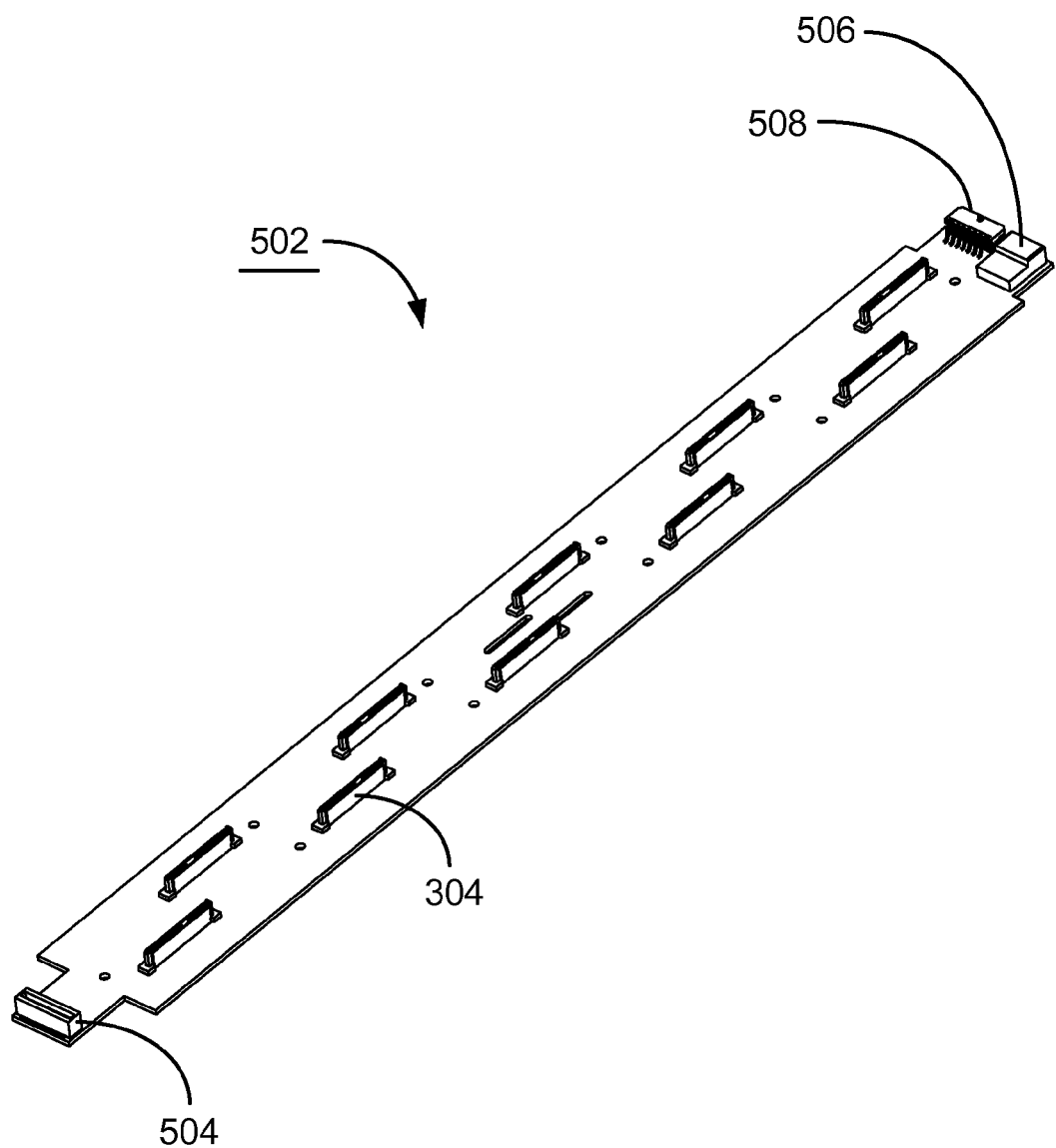
FIG. 5 shows an embodiment consistent with the present invention of a top view of a blade plate board of the illustrative commercial HDA embodiment in more detail.

FIG. 5 shows a top view of the blade plate board 502 of the illustrative commercial HDA embodiment in more detail. The blade plate board 502 is a substrate adapted to support power and communication pathways such as electrical lines or traces or other conductive lines in addition to connector structures, such as SAS connectors 304, connected to the pathways that link the data storage elements to the blade connector 132 connector structures. The blade plate board 502 is substantially fixedly attached to the underside of the blade plate 214 via screws in this example. The board provides for ten connectors 304, a bezel module connector 504, an in-band connector 506, for providing communication between a drive 206 (such as SAS communication) and a server (not shown) for example, and an out-of-band connector 508, for providing power and control components such as the bezel module 504, for example.

Figure 6:
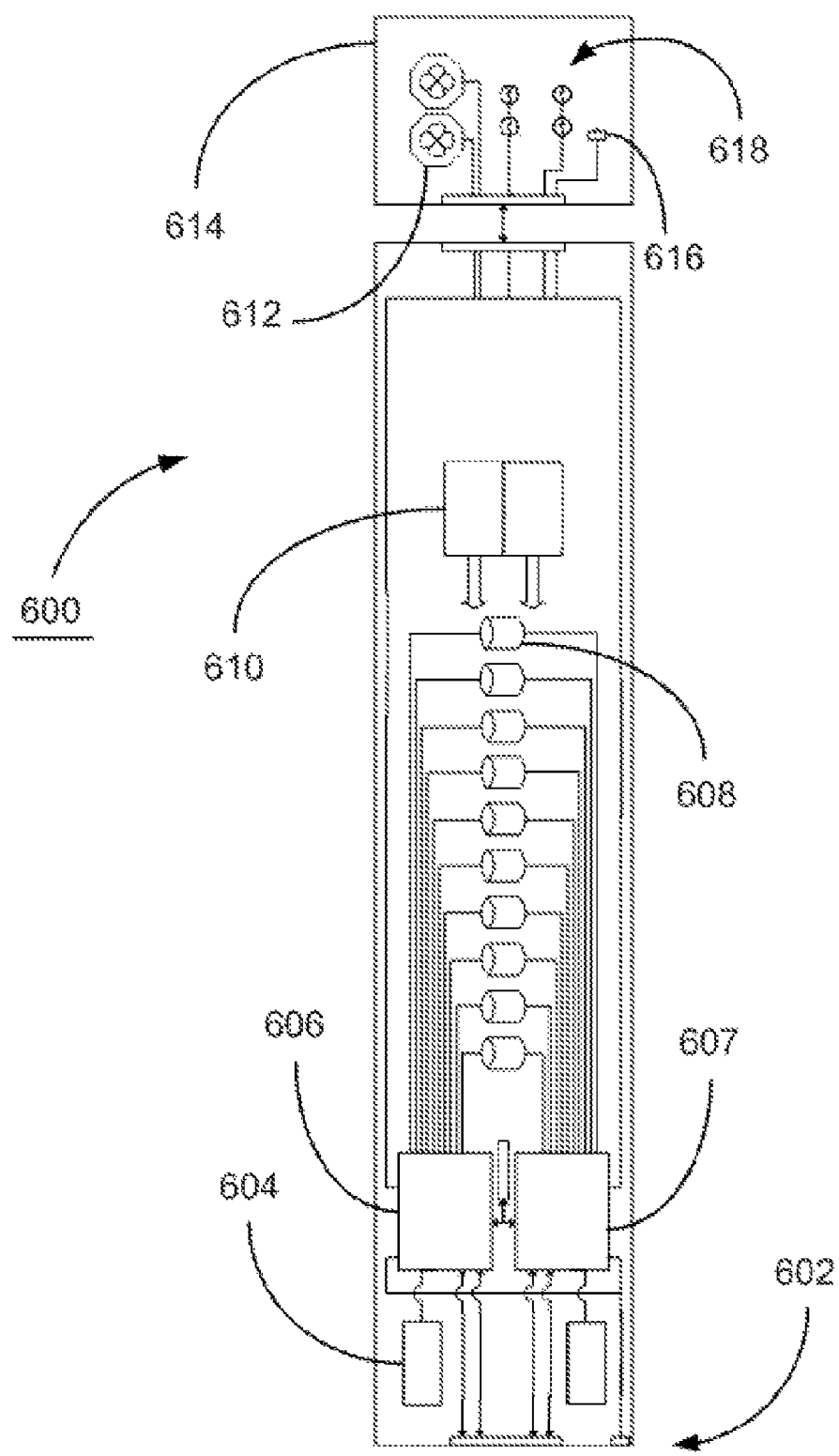
FIG. 6 shows an embodiment consistent with the present invention of an illustration of a blade board schematic layout of the blade plate board of FIG. 5.

FIG. 6 is an illustration of an embodiment of a blade board schematic layout 600 of the blade plate board 502 of FIG. 5 capable of being used with the storage media blade 200 of FIG. 2A. As illustrated, power and communication are received from the HDA unit 100 from the HDA connector end 602 of the board layout 600. In general, the board 502 provides a pathway between an initiator, such as a server, and a target, such as a disk drive 608 wherein communication may pass through one or more port expanders, or other routers, to complete a target path between the initiator and target. In this configuration, the board comprises two port expanders 606 and 607, such as an SAS X12A expander chip, or alternatively a X36 expander chip (just to name two examples) from LSI Logic of Milpitas, Calif., each capable of routing communication between a server, for example, and any of the ten drives 608 communicatively linked with the storage media blade 200. In this configuration, the storage media blade 200 only requires one primary port expander 606 with twelve ports to fully operate; however the back-up port expander 607 serves in a redundant port expander should the primary port expander 606 fail. In this configuration, a port expander 606 is a routing device which dedicates ten ports to the ten disk drives 608 and two ports communicate with two other devices, such as two servers or a server and another board or port expander, for example. One skilled in the art will appreciate that routing data can be accomplished with a variety of routing devices which are not limited to a port expander. Multiple blade plate boards 502 can be interconnected via additional port expanders, such as port expanders 606 and 608, on other boards 502 which can serve a purpose to provide communication for multiple devices, such as multiple servers or other clients, for example. The board layout 600 is also shown to comprise two redundant 3.3V/1.2V power supply controllers 604 for the port expanders 606 and 607. Two redundant 5V/12V power supply controllers 610 are, at least, dedicated to the disk drives 608.

Also shown in FIG. 6 is a schematic for the bezel module layout 614 of the bezel module 202 of FIG. 2A. The bezel module layout 614 shows two fans 612 (which optionally can serve as redundant units), a reset button 616 for resetting power to just the storage media blade 200 and not the entire HDA unit 100, and status LEDs. The status LEDs can include, for example, a system status LED, individual drive status LED, Ethernet status/Ethernet ports system management LEDs, or any other activity indicating device. As one skilled in the art will appreciate, there are a number of optional board layouts the can complete the primary function of the board 502 which is to transmit power to components associated with the board 502 and direct communication between at least a drive 608 and a server, for example.

Figure 7:
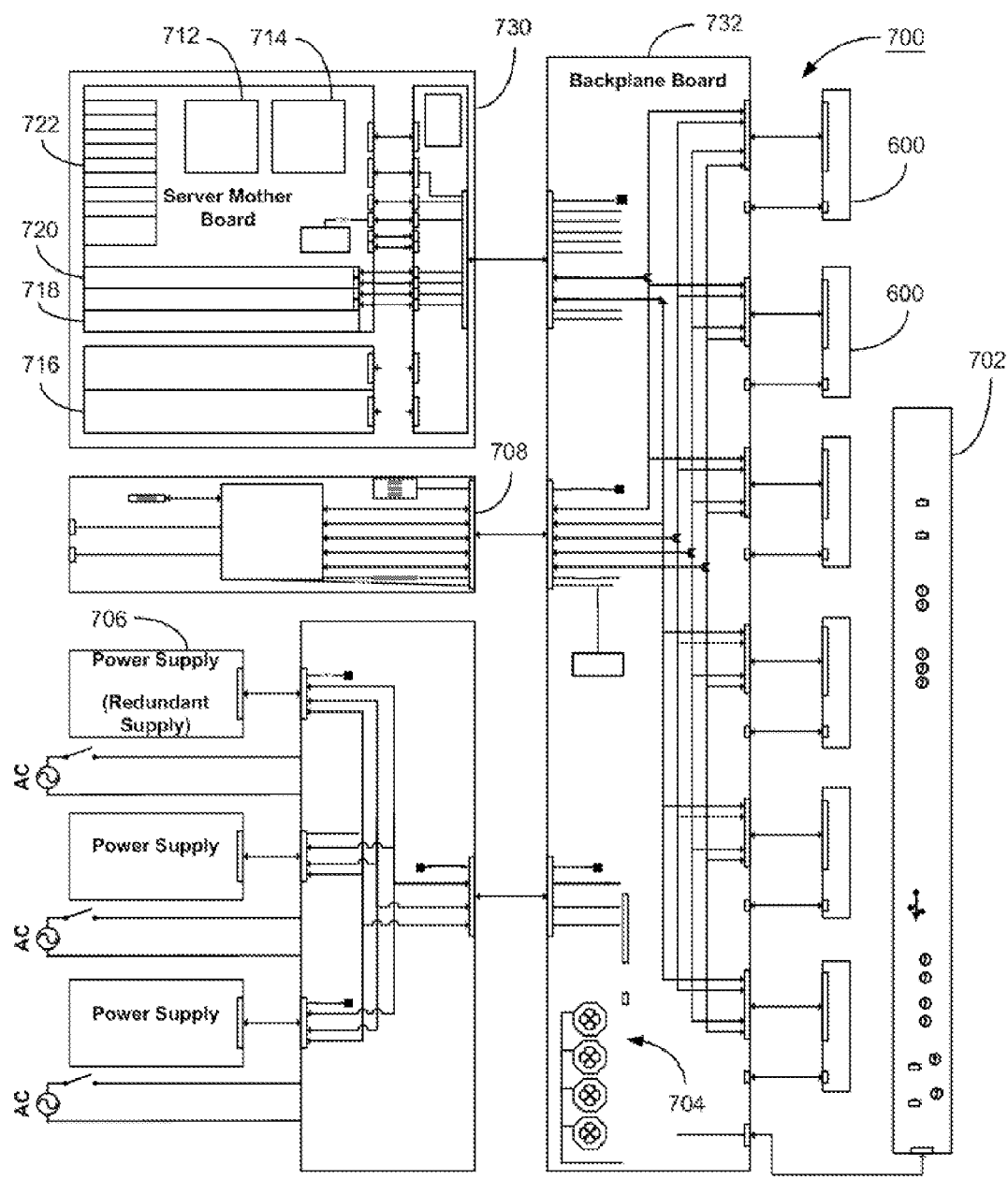
FIG. 7 is an illustrative embodiment of one optional configuration of an HDA unit schematic layout consistent with embodiments of the present invention.

FIG. 7 is an illustration of one optional configuration of an HDA unit schematic layout 700 consistent with embodiments of the present invention. As shown, the HDA layout 700 generally comprises a server unit layout 730, a 36-port SAS Expander port layout 708 (or optionally redundant 36-port expanders), a power supply system layout 706 with redundancy, a backplane board layout 732, a user interface board layout 702 and six blade plate board layouts 600 as shown in detail in FIG. 6. With reference to the server unit layout 730, shown therein are redundant server boot drives 716 (but as one skilled in the art would recognize, alternative storage devices could be used in place of a boot drive 716), redundant SAS PCI cards 720 each comprising eight ports and location for accommodating four additional PCI cards 718, user interface 722, dynamic memory 712 and dual CPU (Central Processing Units) 714. The six blades 600 and user interface board 702 connect to the backplane board 732 through which power is transmitted and communication can be exchanged. The backplane board 732, in this configuration, is capable of providing power and control to four (or more or less) cooling fans 704. The HDA unit 100 can show a low level operational status and basic functionality for an operator via the user interface board 702 which can comprise a power switch, a reset switch, and identification button for various elements within the HDA unit 100, USB connectors for flash key drives, keyboard and mouse connections from the front of the unit 100, wireless devices, etc., in addition to status lights for general system status, Ethernet status, etc. Optional configurations can include additional port expanders and more complex server/motherboard system(s) without deviating from the spirit of the present invention.

Figure 8A:
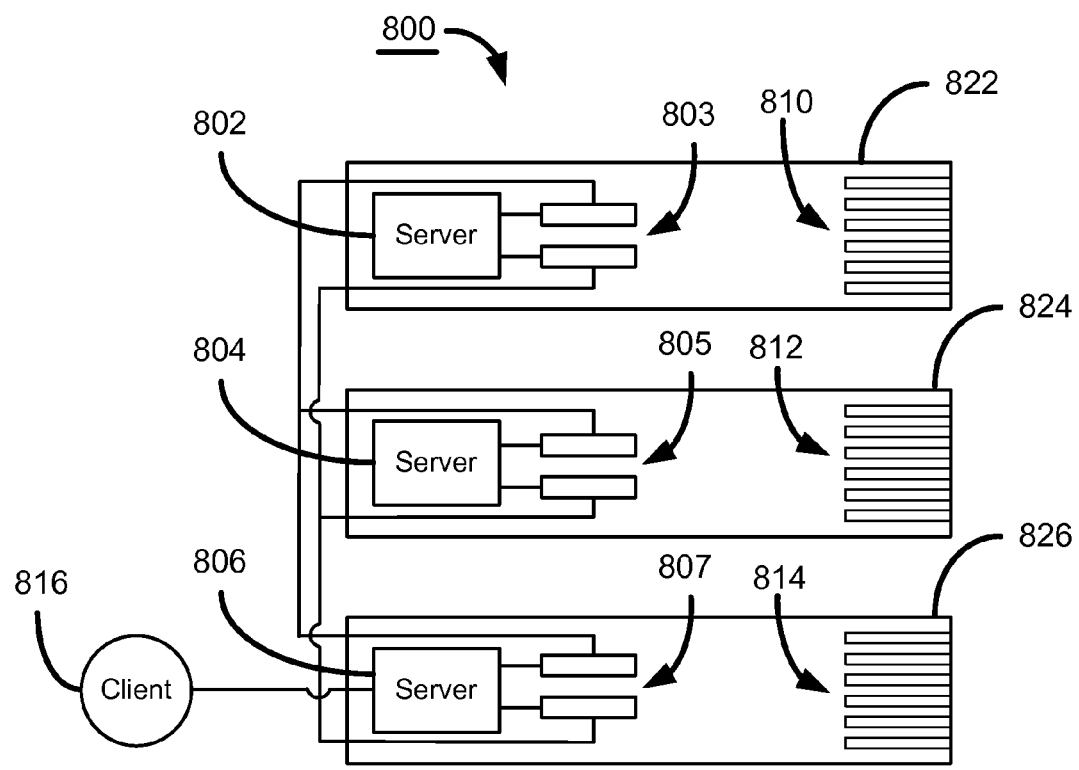
FIG. 8A is an illustration of an interconnected multi-HDA system schematic layout consistent with embodiments of the present invention.

FIG. 8A is an illustration of an interconnected multi-HDA system schematic layout 800. As shown, three HDA units 822, 824 and 826 are interconnected through respective routers 803, 805, 807, such as dual 36-port SAS expanders, and servers 802, 804 and 806. The third HDA unit 826 can be connected to a network client 816 over a pathway such as ISCSI, Ethernet, Fiber channel, etc. The server boxes 802, 804 and 806 can, optionally, be interconnected further serving as a failsafe in the event a server box fails. All HDA units 822, 824 and 826 can function independently saving data on each of the associated storage media blades 810, 812, 814. As will be appreciated by a skilled artisan, there are a variety of ways to interconnect the multiple HDA units 822, 824 and 826 with the general interconnected functionality as shown without deviating from the present invention. It should also be clear that the three HDA units 822, 824 and 826 are illustrative and that a multi-HDA system can comprise an unlimited number of HDA units.

Figure 8B:
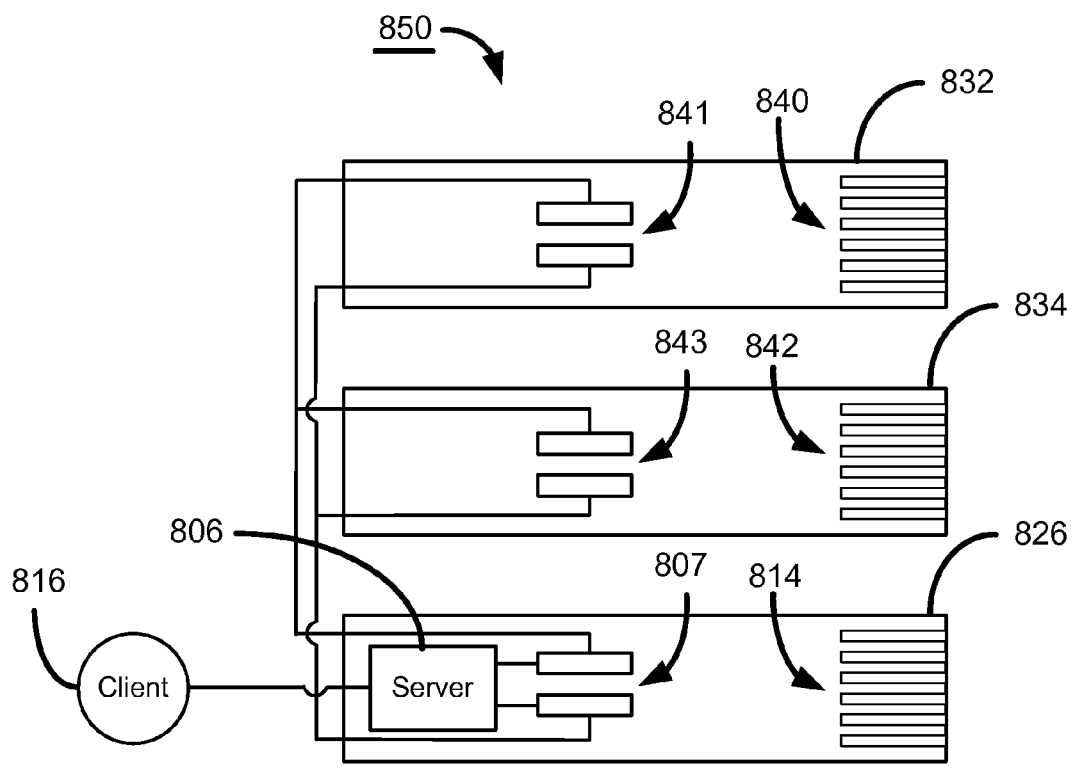
FIG. 8B is an illustration of a master HDA and add-on storage media unit layout consistent with embodiments of the present invention.

FIG. 8B is an illustration of a master HDA and add-on storage media unit layout 850. In this configuration, two add-on storage media units 832 and 834 are interconnected through routers 841 and 843, respectively, whereby the server 806 operates as a master unit for all of the storage media blades 814, 840 and 842. The HDA unit 826 can also interface with a client 816. As will be appreciated by a skilled artisan, there are a variety of ways to interconnect a master HDA unit 826 with multiple add-on units 832 and 834 while preserving the general interconnected functionality as shown without deviating from the spirit of the present invention.

Figure 8C:
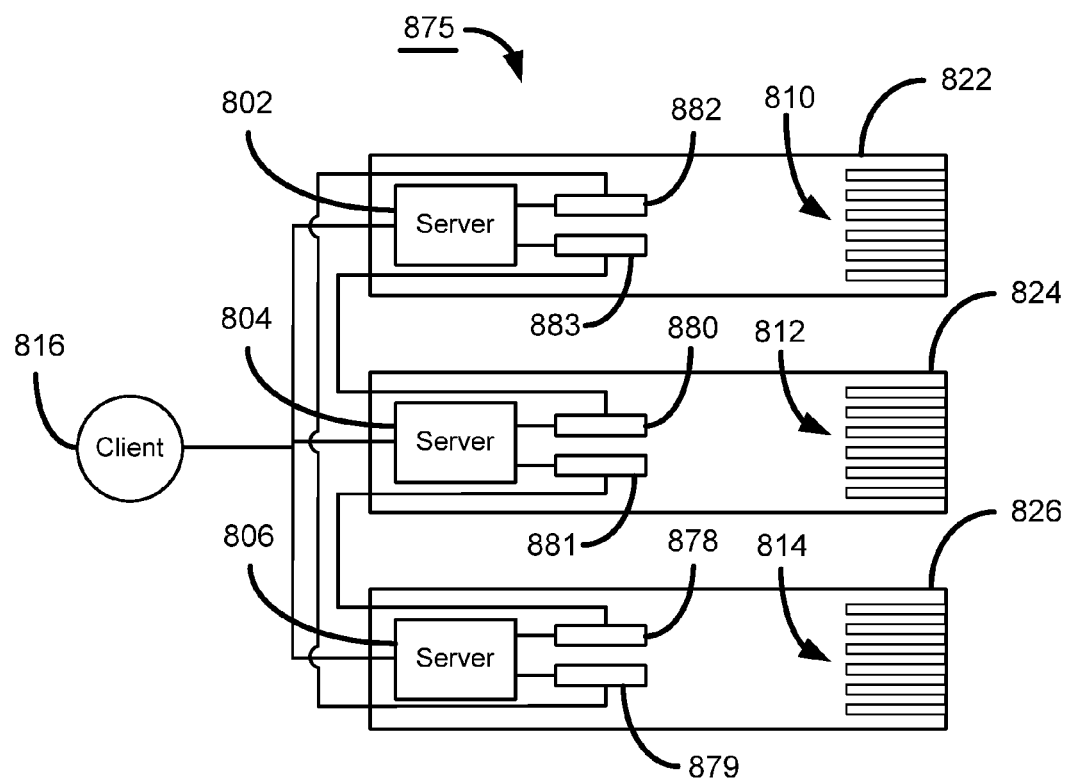
FIG. 8C is an illustration of a looped connected multi-HDA system schematic layout consistent with embodiments of the present invention.

FIG. 8C is an illustration of a looped connected multi-HDA system schematic layout 875. As shown, the client 816 can be in communication with the three HDA units 822, 824 and 826 over a network. In one embodiment, a server, such as server 806, can be the primary, or active, server and the other servers 802 and 804, passive servers. As shown, a first HDA unit 826 is connected to a second HDA unit 824 via a first port expander 878 associated with the first HDA unit 826 and a second port expander 881 associated with the second HDA unit 824. The second HDA unit 824 is connected to a third HDA unit 822 via a third port expander 880 associated with the second HDA unit 824 and a fourth port expander 883 associated with the third HDA unit 822. Optionally, the third HDA unit 822 can be connected to the first HDA unit 826 via fifth port expander 882 associated with the third HDA unit 822 and a sixth port expander 879 associated with the first HDA unit 826. In the event a server fails, such as the second server 804 associated with second HDA unit 824, a different server, such as the first server 806 associated with first HDA unit 826, can function as the active server effectively bypassing the failed second server 804. In one embodiment of the present invention, a server unit, such as server 804, can be configured to be hot-swappable, that is removable without interruption to the system. The HDA units, such as the second HDA unit 824, can be adapted to accommodate the second server 804, or any number of different modular units such as another server or RAID controller for example, in a universal module space (described in detail in FIG. 11) whereby the server 804 can be removed without interruption to the system 875. For example, the bypassing functionality effectively bypassing a failed server unit can be identically used to bypass a server with a mother board if removed from the system, such as the system 875, when in operation without interruption to the system.

Figure 9:
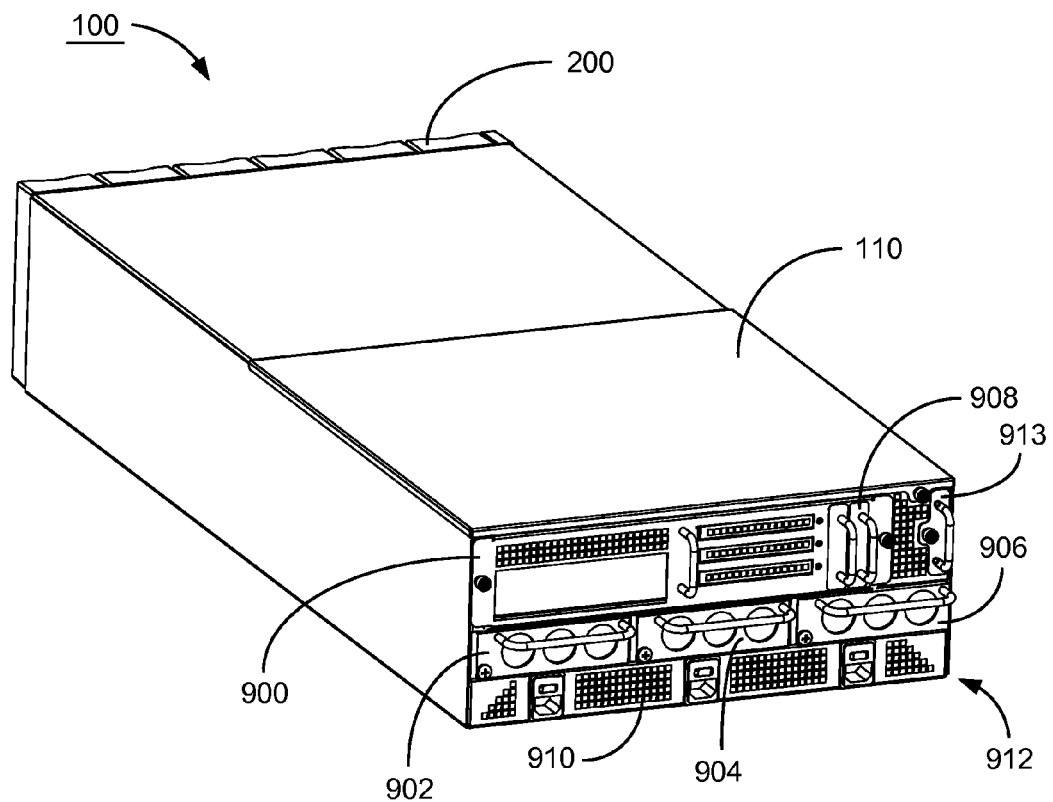
FIG. 9 shows the commercial embodiment of an HDA unit with the back surface presented consistent with embodiments of the present invention.
Figure 10:
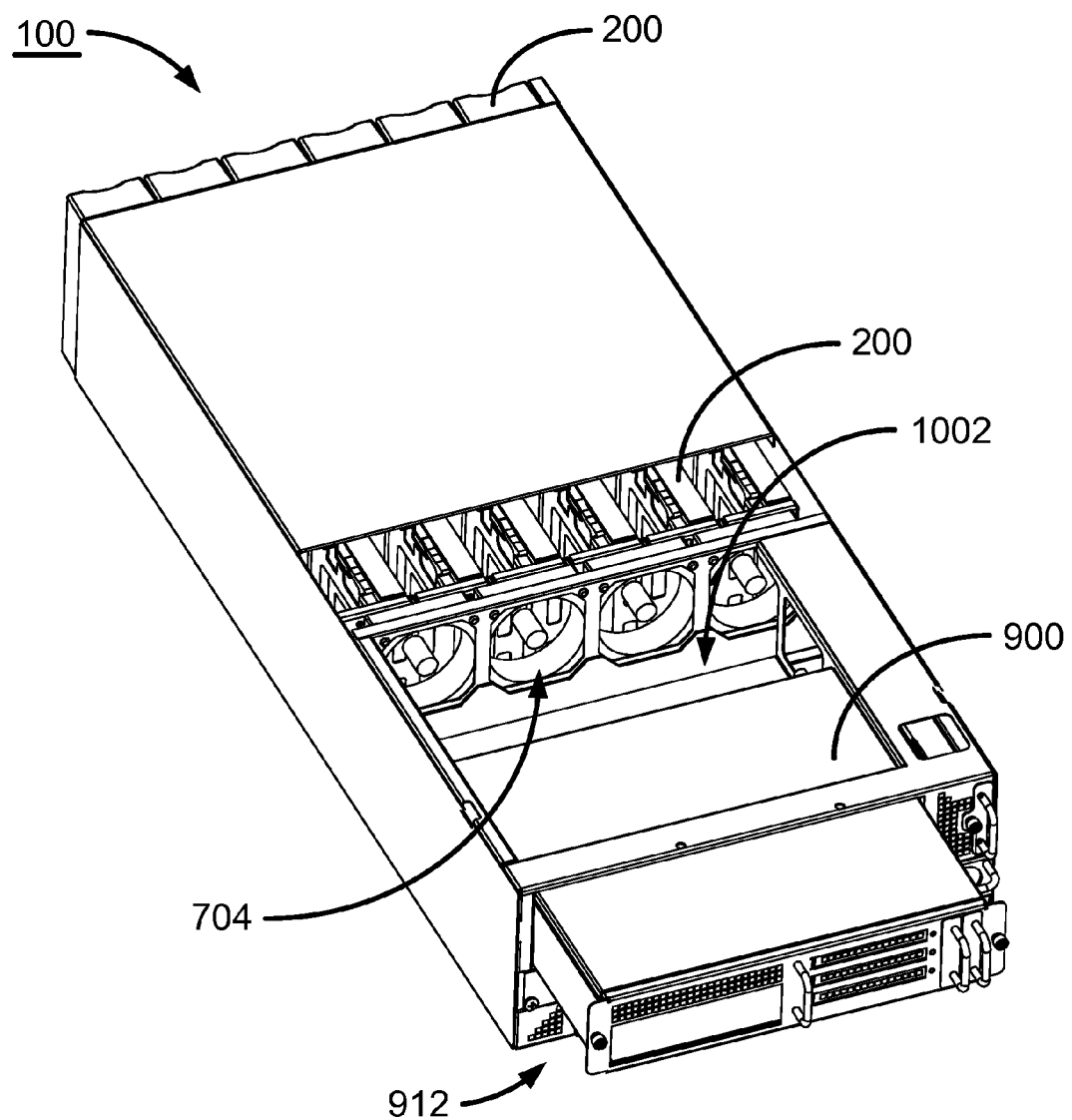
FIG. 10 shows the commercial embodiment of an HDA unit with the back surface presented without the removable panel and a server module partially removed consistent with embodiments of the present invention.

With reference to FIGS. 9 and 10, shown therein is an embodiment of HDA unit 100 with the back surface 912 presented. The HDA unit 100 comprises a removable server unit 900 that can comprise two modular boot drives 908. Also shown are three removable power supplies 904, 904 and 906 and modular port expanders 9. Ventilation holes 910 are shown distributed on much of the back side 912 as shown for general HDA 100 cooling. FIG. 10 shows the HDA unit 100 with the removable panel 110 taken off exposing an interior portion 1002 adapted to accommodate the removable server unit 900 (which is shown partially in the HDA unit 100). In this illustration four of the cooling fans 704 are shown for providing cooling to the storage media blades 200.

Figure 11:
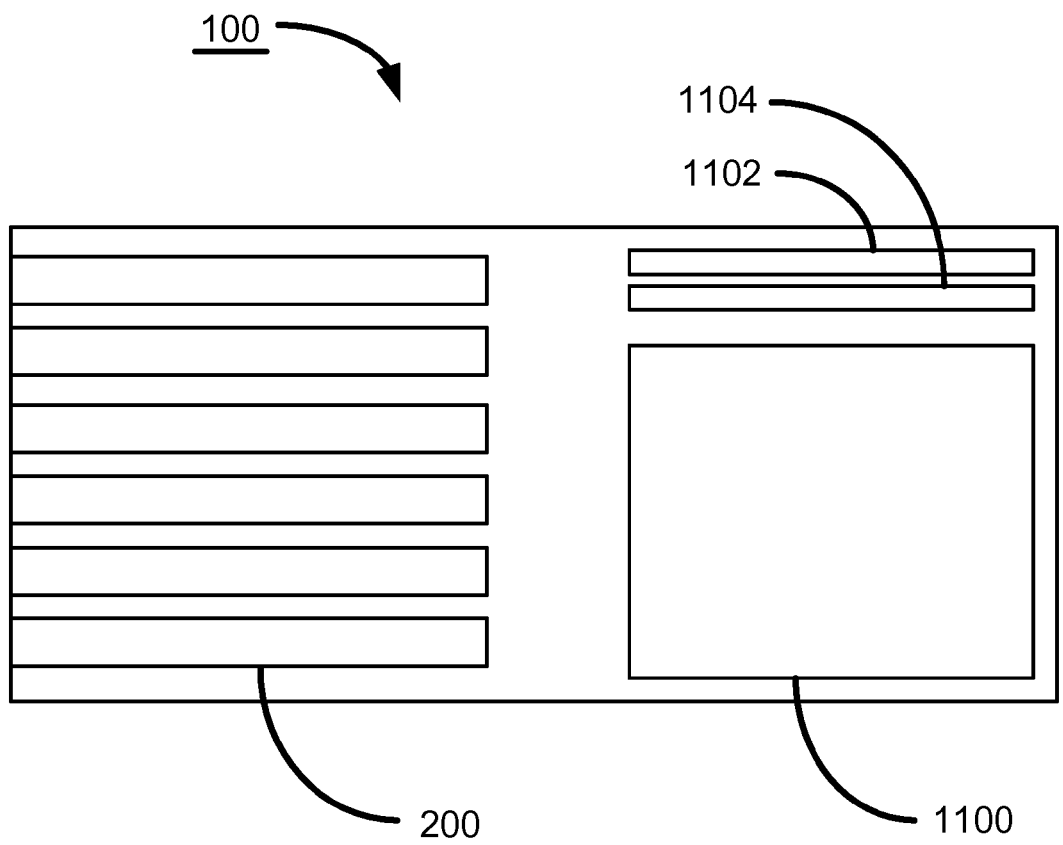
FIG. 11 is a block diagram of a top view of the HDA unit without the cover and removable panel consistent with embodiments of the present invention.

FIG. 11 is a block diagram of a top view of the HDA unit 100 without the cover 106 and removable panel 110. Shown therein are six storage media blades 200, a first and second port expander unit 1102 and 1104, respectively, and a universal module space 1100. The universal module space 1100 is adapted to functionally accommodate a variety of modular units, for example, a server, such as the server unit 900 of FIG. 9, a RAID controller, a JBOD (Just a Bunch of Disk [drives]), a channel bridge (such as a SAS to fiber channel bridge), etc. In one embodiment, a modular unit, such as the server unit 900, can comprise a sled apparatus (not shown) adapted to cooperate with features in the universal module space 1100 for efficient insertion and removal from the unit 100. Means to electrically and communicatively link the HDA unit 100 with a module can include a universal set of electrical contacts, or alternatively, specific sets of contacts disposed in the HDA unit 100 dedicated for specific modular units. As one skilled in the art will appreciate, there are a variety of ways to link a module with the HDA unit 100 when installed in the universal module space 1100. An external server can interact with the HDA unit 100 via the port expander units 1102 and 1104, or equivalent routing system(s).

Generally speaking, in one aspect of the present invention, a storage unit can comprise: a cover at least in part defining a storage unit interior space; at least one media blade capable of removably supporting a plurality of storage elements; the media blade adapted to provide at least a communication pathway and power between the storage elements and the storage unit; the media blade capable of being at least partially moved into and out from the interior space without interruption of the power and communication. The storage unit can further comprise a latch mechanism to prevent the media blade from totally being removed from the unit interior space. The storage unit can further be adapted to be received by an accommodating opening in the frame. Additionally, the storage unit can be adapted to accommodate six media blades.

The media blade can be partially moved between a retracted position wherein substantially all of the storage elements are within the interior space and an extended position wherein substantially all of the storage elements are external to the interior space. Additionally, the storage blade can be retained by a locking mechanism and supported by the storage unit when in the extended position.

The storage unit can optionally comprise storage elements selected from one of the group consisting of: a disk drive, flash memory (or other kind of solid state storage memory), compact disk, magneto-optical drive, floppy disk drive and holographic drive.

The power and communication can be provided to the media blade by a power and communication linking device selected from one of the group consisting of: a ribbon cable, at least one independent conductive wire, a flexible cable, at least one group of conductive wires. Additionally, the power and communication linking device can comprise a tangling prevention device. Furthermore, the tangling prevention device can be a flex chain linkage. Optionally, the tangling prevention device can be a spring loaded spindle. The power can be provided by a brush and conductive lead system and the communication can be transmitted wirelessly.

Figure 12:
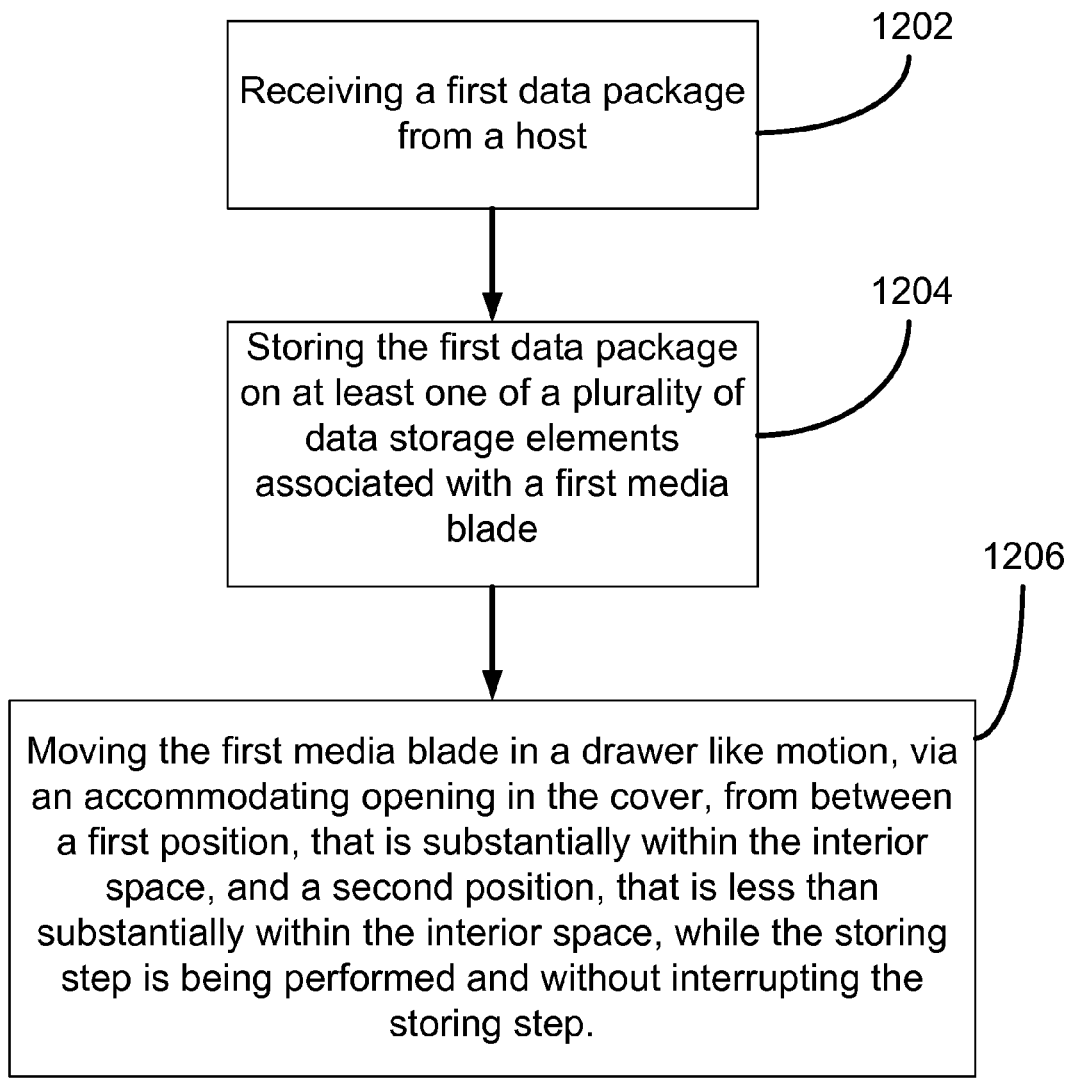
FIG. 12 is a block diagram of a method of operation of an embodiment of the present invention.

The storage media blade of the storage unit can comprise a base for supporting a base board through which the communication and power can be transmitted, a bezel module, a mid-plane frame, blade power connector and blade communication connector. The blade base can accommodate a plurality of storage element power and communication connectors for the storage elements. The storage element power and communication connectors can be Serial Attached Small Computer System Interface connectors. The bezel module can be removably attached to the storage media blade and comprises a handle, at least one indication light associated with each of the storage elements, at least one fan speed controllable and a blade reset button. The blade power and blade communication connectors connect to the power and communication linking device. The storage elements can be disposed on either side of the mid-plane frame. The storage elements can be disk drives wherein the disk drive can optionally be at least two different storage density capacities, different disk rotation speeds, or different disk drive form factors. In the embodiment wherein the storage elements are disk drives magnetic disks comprised by the disk drives can rotate in opposite directions when mounted on opposite sides of the mid-plane frame. The storage elements can optionally be mounted to a mid-plane retaining plate that cooperates with the mid-plane to hold the storage elements substantially in place when electrically connected to the base board. The retaining plate can accommodate alternate form factor storage elements. The storage media blade can further comprise a latch mechanism to removably and substantially lock the storage element to the blade. The base board of the blade further can comprise storage element activity indicators for each storage element corresponding to the at least one indication light associated with each of the storage elements on the bezel board. The storage element activity indicators can be Light Emitting Diodes located in proximity to each storage element. As a skilled artisan would recognize, other light indicating devices/emitters or light sources and reflecting devices, etc. can be used to accomplish the same result as a Light Emitting Diode without departing from the present invention. The storage unit can further be adapted to cooperate with a second storage unit to comprise a storage system capable interacting with a host. All of the storage units can be substantially identical, or optionally the second storage unit can be just a bunch of storage elements or drives (JBOD) such as, for example, capable of being field adaptable to be able to switch from a JBOD to full operating mode. Both storage units can each further comprise a universal module space located in the interior space adapted to accommodate a server module, i.e. a first modular server unit for the original storage unit and a second modular server unit for the second storage unit. The first modular server unit can function as a master server unit taking over server operations for both the original storage unit and the second storage unit. Optionally, the second modular server unit can be made to function as the maser server unit. In one embodiment, the second modular server unit can be made to function as the maser server unit when the first server unit fails wherein functionality of the system remains uninterrupted. In an alternative embodiment, the second modular server unit can be made to function as the maser server unit when the first server unit is removed in a hot-swap operation wherein functionality of the system remains uninterrupted. The storage system can comprise a third storage unit wherein the storage units can be interconnected through a loop system wherein the storage unit from claim 1 is connected to the second storage unit and the second storage unit is connected to the third storage unit. The storage units can all interconnected via router devices. Optionally, the original storage unit can be connected to both the second storage unit and the third storage unit; the second storage unit can be connected to both the original storage unit and the third storage unit. Referring now to FIG. 12, shown therein is a method to practice an embodiment of the present invention. It should be recognized that the steps presented in the described embodiments of the present invention do not require any particular sequence unless otherwise stated. Also, similar elements are used from FIG. 1B for purposes of illustration in this embodiment but are not intended to limit the methods presented herein the elements of FIG. 1B. As shown in FIG. 12, a storage unit 100 comprising a cover 106 that defines at least part of an interior space, the method comprises the acts of receiving 1202 a first data package from a host, storing 1204 the first data package on at least one of a plurality of data storage elements 206 associated with a first media blade 102; and moving 1206 the first media blade 102 in a drawer like motion, via an accommodating opening 107 in the cover 106, from between a first position (as shown with the media blades 104), that is substantially within the interior space, and a second position (as shown with the extended media blade 105), that is less than substantially within the interior space, while the storing step is being performed and without interrupting the storing step. An accommodating opening, such as the opening 107, is an opening that is specifically tailored to accommodate the movement of a media blade, such as the media blade 105, between the first and second position, such as the media blades of 104 and that of media blade 105. In one embodiment, the accommodating opening provides assistance in supporting the media blade to be moved in the drawer like motion. In another embodiment of the present invention, the opening can provide at least part of a guided pathway for the media blade to move from the first to second positions. In an alternative embodiment of the present invention, the method steps of receiving 1202 and storing 1204 occur before the moving step 1206.

The storage unit method can optionally be further defined such that the first position is when at least all of the storage elements are within the interior space. The second position can be when all of the storage elements are out side of the interior space. The method can further comprising storing the first data redundantly using a RAID level format, such as RAID level-5 for example. In one embodiment, at least one of the plurality of storage elements can be removed from the first storage media blade when in the second position without substantially interrupting storing of the first data. The removed storage element can be replaced with a different form factor storage element, a different storage capacity storage element, or a different data handling rate.

The method can further comprise exchanging a modular unit in a universal space that is substantially within the interior space without interruption to the storing of the first data. The modular unit can be of the group consisting of: a JBOD, a server unit, RAID controller, a storage array and a routing unit.

The storage unit method can further comprise receiving a second data package from the host; storing the second data package on a second storage media blade wherein the second storage media blade comprises a second plurality of data storage elements; moving the second storage media blade from a first position that is substantially within the interior space to a second position that is less than substantially within the interior space without interrupting the storing of the second data. This can further comprise storing the second data redundantly in a RAID level format on the second storage media blade. Alternatively, this can further comprise storing the second data redundantly in a RAID level format across the first and second storage media blades.

In yet another aspect of the present invention, a storage system can comprise a first and second storage unit, the storage system capable of performing the steps of: receiving a first data package from a host; storing the first data package on a first storage media blade associated with the first storage unit wherein the first storage media blade comprises a plurality of data storage elements; moving the first storage media blade from a first position that is substantially within the interior space to a second position that is less than substantially within the interior space without interrupting the storing.

The method can further comprise receiving a second data package from the host; storing the second data package on a second storage media blade associated with the second storage unit wherein the second storage media blade comprises a plurality of data storage elements; moving the second storage media blade from a first position that is substantially within the interior space to a second position that is less than substantially within the interior space without interrupting the storing. This can further comprise storing the second data redundantly in a RAID level format across the first and second storage units. Optionally, this can further comprise the first storage unit controls the storage of the first data on the first unit and the first storage unit controls the storage of the second data on the second unit. Optionally this can further comprise the second storage unit assumes control of the storage of the first and second data if the first storage unit fails to control the storage of the first and second data.

In yet another aspect of the present invention, a storage system comprising at least one storage unit, the storage unit can comprise: a frame defining a storage unit interior space; at least one media blade capable of removably supporting a plurality of storage elements wherein the media blade is adapted to provide a communicating path between the storage elements and the storage unit; the media blade capable of moving between a retracted position wherein substantially all of the storage elements are within the interior space and an extended position wherein substantially all of the storage elements are external to the interior space; a means to provide uninterrupted power and communication to the media blade when the media blade is at or between the retracted and extended positions.

In yet another aspect of the present invention a storage unit comprising a frame that defines and interior space, a means for storage unit operation can comprise: means for receiving a first data package from a host; means for storing the first data package on a first storage media blade wherein the first storage media blade comprises a plurality of data storage elements; means for moving the first storage media blade from a first position that is substantially within the interior space to a second position that is less than substantially within the interior space without interrupting the storing.

Optionally, the means plus function embodiments can further include, means for storing the first data redundantly using a RAID level format. Means for further receiving a second data package from the host; means for storing the second data package on a second storage media blade wherein the second storage media blade comprises a second plurality of data storage elements; means for moving the second storage media blade from a first position that is substantially within the interior space to a second position that is less than substantially within the interior space without interrupting the storing of the second data.

The means plus function can further comprise means for storing the second data redundantly in a RAID level format on the second storage media blade or optionally means for storing the second data redundantly in a RAID level format across the first and second storage media blades.

The means plus function can further comprise means for exchanging a modular unit in a universal space that is substantially within the interior space without interruption to the storing of the first data.

In another aspect of the present invention, a storage system comprising a first and second storage unit, a means for the storage system to operate can comprise: a means for receiving a first data package from a host; a means for storing the first data package on a first storage media blade associated with the first storage unit wherein the first storage media blade comprises a plurality of data storage elements; a means for moving the first storage media blade from a first position that is substantially within the interior space to a second position that is less than substantially within the interior space without interrupting the storing.

The means plus function can further comprise means for receiving a second data package from the host; means for storing the second data package on a second storage media blade associated with the second storage unit wherein the second storage media blade comprises a plurality of data storage elements; means for moving the second storage media blade from a first position that is substantially within the interior space to a second position that is less than substantially within the interior space without interrupting the storing. Additionally, this can further comprise a means for storing the second data redundantly in a RAID level format across the first and second storage units.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, alternate board layouts and features specific to market needs can be used with an HDA, such as the HDA system 800, for example, while still maintaining substantially the same functionality without departing from the scope and spirit of the present invention. Another example can include various means to provide uninterrupted power and communication to a storage media blade, such as the storage media blade 200, when moved between a retracted and extended position while still maintaining substantially the same functionality without departing from the scope and spirit of the present invention. Although the preferred embodiments described herein are directed to disk drive systems, such as the disk drive blade 200, and related technology, it will be appreciated by those skilled in the art that the teachings of the present invention can be applied to other systems and storage media, without departing from the spirit and scope of the present invention.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed.

What is claimed is:

1. A method of operating a data storage unit wherein the data storage unit comprises a cover that defines, at least in part, an interior space, the method comprising:
    receiving a first data package from a host;
    storing the first data package on at least one of a plurality of disk drives associated with a first media blade, the disk drives possessing disks that rotate when operable;
    moving the first media blade in a drawer like motion, via an accommodating opening in the cover, from between a first position, that is substantially within the interior space, and a second position, that is less than substantially within the interior space, while the storing step is being performed and without interrupting the storing step;
    the first media blade possessing a mid-plane frame with a first side and a second side wherein any of the disk drives associated with the first side are arranged such that the disks rotate in an opposite direction as the disks associated with any of the disk drives associated with the second side.

2. The method of claim 1 further comprising transmitting the first data package from a communication source disposed in the data storage unit to the disk drives via a motion accommodating conductor apparatus that is tangle inhibiting.

3. The method of claim 1 further comprising swapping one of the disk drives with a different disk drive when the media blade is in the second position.

4. The method of claim 1 wherein the receiving and storing steps occur before the moving step.

5. The method of claim 1 further comprising manually locking the disk drives to the media blade via a latch mechanism.

6. The method of claim 1 further comprising receiving the first media blade in an accommodating opening in the data storage unit.

7. The method of claim 1 wherein the data storage unit is adapted to accommodate a plurality of media blades.

8. The method of claim 1 further comprising providing a base that supports the mid-plane frame on a top side and supports a base board on a bottom side, communication and the power adapted to be transmitted to the disk drives via the base board.

9. A data storage unit having a source of electronic communication and a source of electronic power, the data storage unit comprising:
   a frame defining a storage unit interior space;
   a media blade possessing a mid-plane frame, the mid-plane frame essentially possessing a first side and a second side wherein the first side accommodates a first plurality of disk drives and the second side accommodates a second plurality of disk drives, at least one of the first plurality of disk drives rotates in an opposite direction from at least one of the second plurality of disk drives;
   the first and the second plurality of disk drives are adapted to receive electronic communication from the source of electronic communication and electronic power from the source of electronic power via the media blade; and
   the media blade adapted to be at least partially moved into and out from the interior space without interruption to the communication and the power.

10. The data storage unit of claim 9 wherein at least one of the first plurality of disk drives opposes at least one of the second plurality of disk drives.

11. The data storage unit of claim 9 wherein all of the first plurality of disk drives oppose all of the second plurality of disk drives and all of the first plurality of disk drives rotate in an opposite direction from all of the second plurality of disk drives.

12. The data storage unit of claim 9 further comprising a second media blade.

13. The data storage unit of claim 9 further comprising a latch mechanism to prevent the media blade from totally being removed from the interior space.

14. The data storage unit of claim 9 wherein the media blade is movable between a retracted position wherein all of the disk drives are in the interior space and an extended position wherein all of the disk drives are external to the interior space.

15. The data storage unit of claim 14 wherein the media blade is adapted to be supported by the data storage unit when fully in the extended position.

16. The data storage unit of claim 9 wherein the media blade comprises a base for supporting a base board, the electronic communication and the electronic power transmittable via the base board and said mid-plane frame extends upward essentially from the middle of said base forming an upside down T as viewed in a cross-section.

17. The data storage unit of claim 9 further comprising a plurality of disk drive latches that are each manually actuated to lock the plurality of disk drives fixedly to the media blade.

18. The data storage unit of claim 9 wherein at least one of the plurality of disk drives is removable from the media blade when the media blade is at least partially moved out from the interior space without interruption of the communication and the power to any remaining disk drives from the plurality of disk drives.

19. A data storage unit comprising:
   a frame defining a storage unit interior space;
   a means for supporting a plurality of disk drives on a media blade such that at least some of the plurality of disk drives are adapted to rotate in an opposite direction to that of others of the disk drives;
   a power source that provides power to the disk drives and a communication source that provides communication to the disk drives;
   a means moving the media blade between a first position, that is substantially within the interior space, and a second position, that is less than substantially within the interior space without interrupting the power and the communication to the plurality of disk drives.

20. The data storage unit of claim 19 further comprising a means for removing at least one of the disk drives from the media blade without disturbing communication and power all of the disk drives that are remaining with the media blade when the media blade is in the second position.

* * * * *